United States Patent
Tokiwa

(10) Patent No.: US 9,013,926 B2
(45) Date of Patent: Apr. 21, 2015

(54) NON-VOLATILE SEMICONDUCTOR STORAGE DEVICE CAPABLE OF INCREASING OPERATING SPEED

(71) Applicant: Kabushiki Kaisha Toshiba, Minato-ku, Tokyo (JP)

(72) Inventor: Naoya Tokiwa, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 53 days.

(21) Appl. No.: 14/026,860

(22) Filed: Sep. 13, 2013

(65) Prior Publication Data

US 2014/0269113 A1    Sep. 18, 2014

(30) Foreign Application Priority Data

Mar. 15, 2013    (JP) ................................ 2013-053499

(51) Int. Cl.
*G11C 11/34* (2006.01)
*G11C 8/10* (2006.01)

(52) U.S. Cl.
CPC ........................................ *G11C 8/10* (2013.01)

(58) Field of Classification Search
USPC ........... 365/185.03, 185.18, 185.23, 189.011, 365/189.14, 189.15, 189.16, 189.08
See application file for complete search history.

(56) References Cited

U.S. PATENT DOCUMENTS

| | | | | |
|---|---|---|---|---|
| 8,228,733 B2 * | 7/2012 | Tokiwa et al. | ........... | 365/185.11 |
| 8,854,521 B2 * | 10/2014 | Yamashita et al. | ............ | 348/308 |
| 8,854,888 B2 * | 10/2014 | Chevallier et al. | ........ | 365/185.18 |
| 2003/0133326 A1 | 7/2003 | Hosono et al. | | |
| 2007/0147121 A1 | 6/2007 | Futatsuyama | | |

OTHER PUBLICATIONS

Kazushige Kanda et al., "A 120 mm² 16Gb 4-MLC NAND Flash Memory with 43nm CMOS Technology" ISSCC 2008 / Session 23 / Non-Volatile Memory / 23.6, Three Pages (in English).

Hynix Semiconductor et al., "Open NAND Flash Interface Specification", Revision 3.0, Mar. 9, 2011, "Read Cache Definition", Eight Pages (in English).

* cited by examiner

*Primary Examiner* — Fernando Hidalgo
(74) *Attorney, Agent, or Firm* — Holtz, Holtz, Goodman & Chick PC

(57) ABSTRACT

According to one embodiment, a non-volatile semiconductor storage device includes a memory cell array, a row decoder, a potential generating circuit, first plural potential selection circuits, a second potential selection circuit, a first discharge circuit, and a second discharge circuit. The first plural potential selection circuits select one of output potentials of the potential generating circuit by receiving a first control signal and apply the selected output potential to a first signal line. The second potential selection circuit applies a potential of the first signal line to a second signal line connected to the row decoder by receiving a second control signal. The first discharge circuit is arranged in the first potential selection circuit. The second discharge circuit is arranged in the second potential selection circuit.

13 Claims, 22 Drawing Sheets

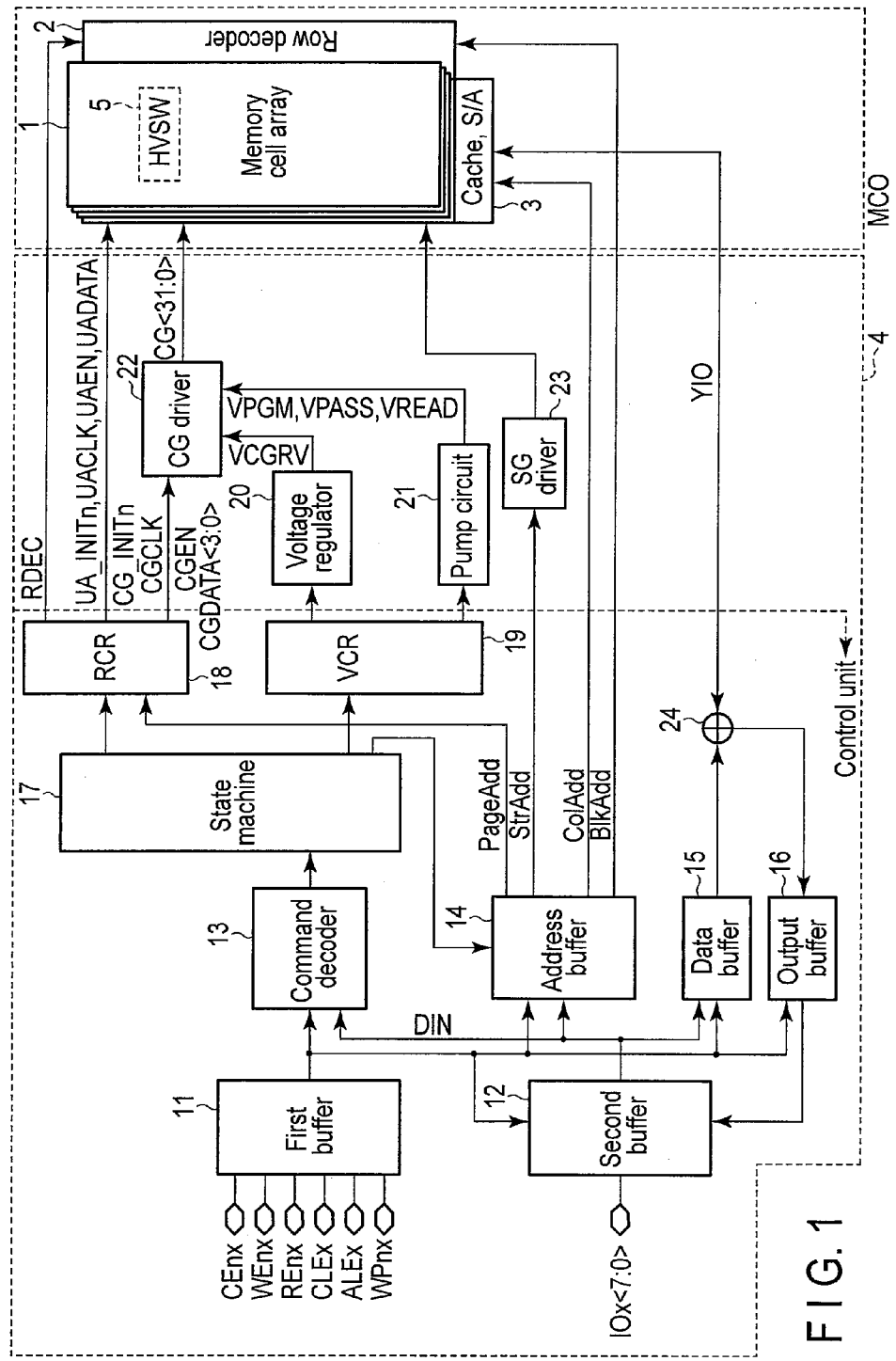
F I G. 1

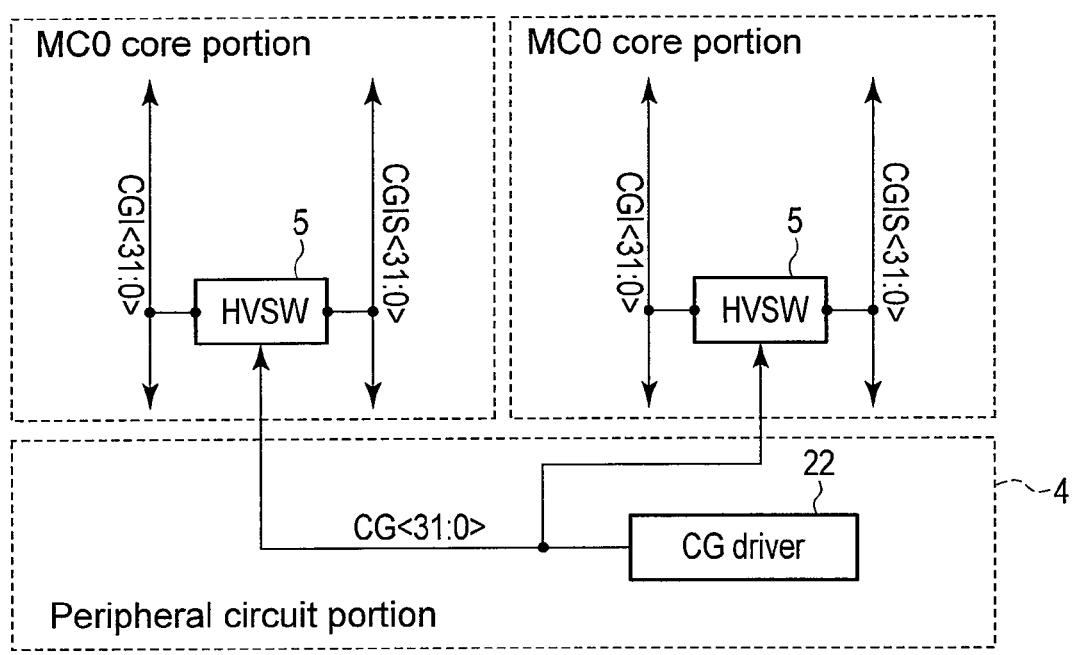
F I G. 5

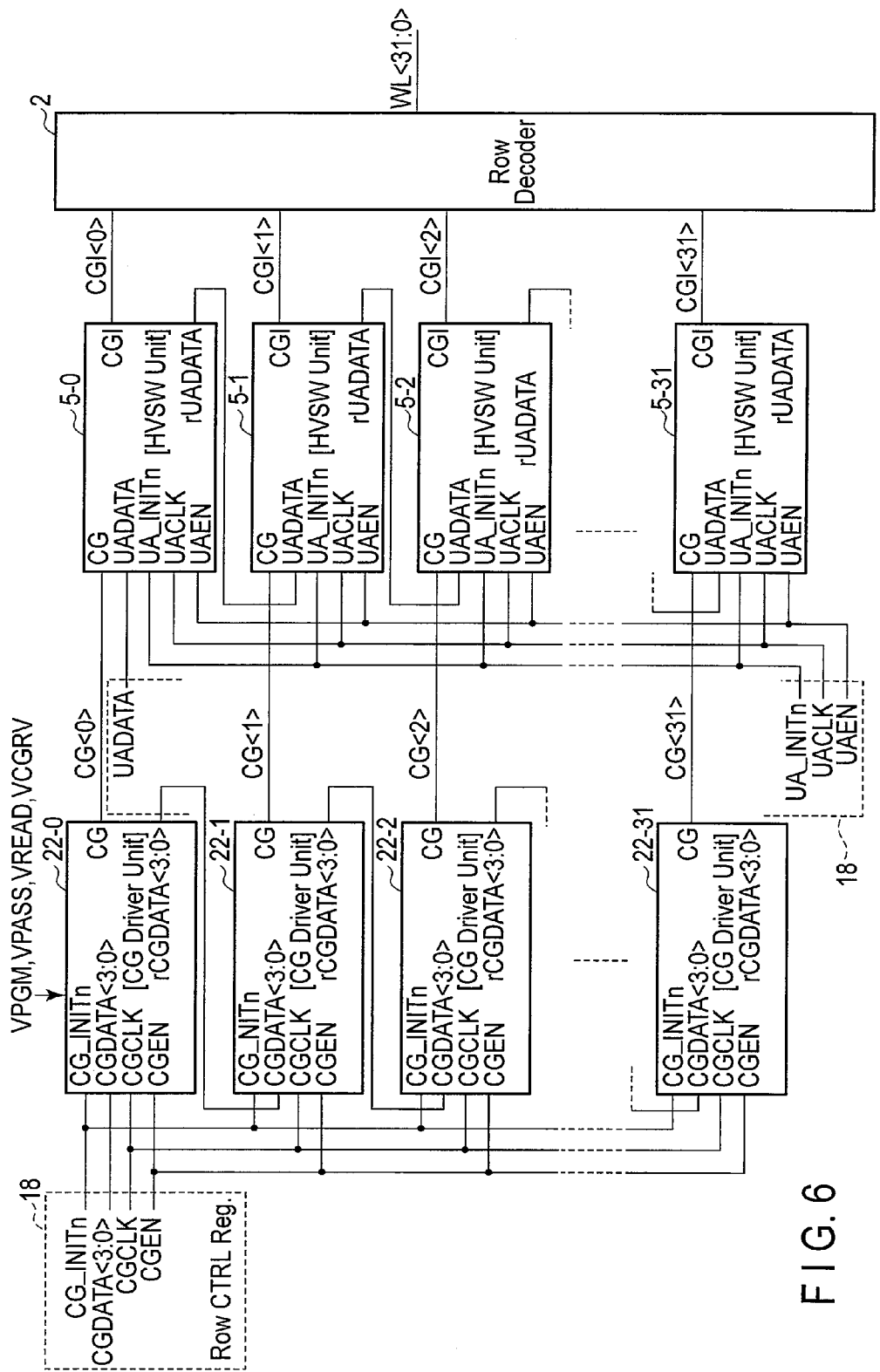
F I G. 6

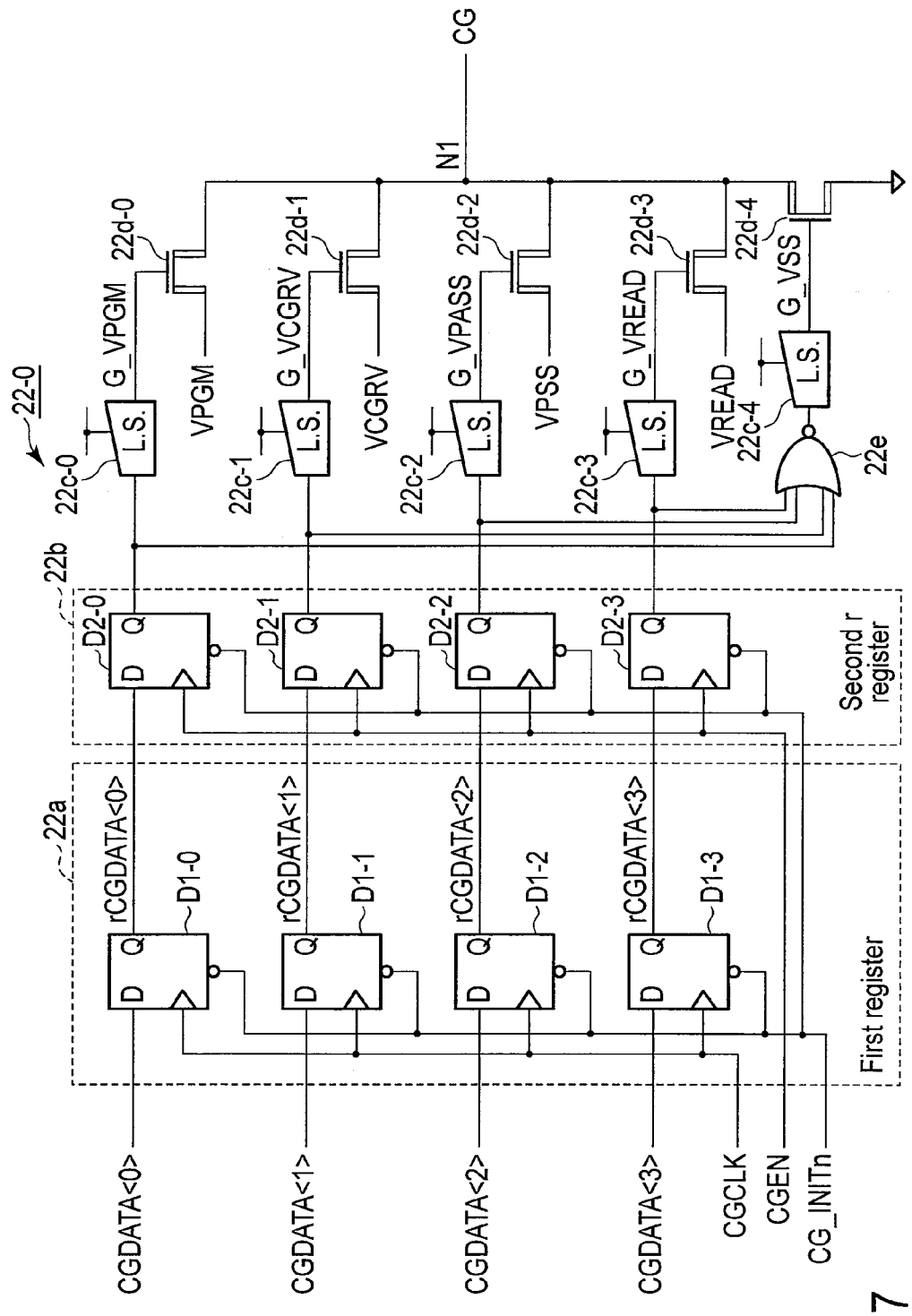
F I G. 7

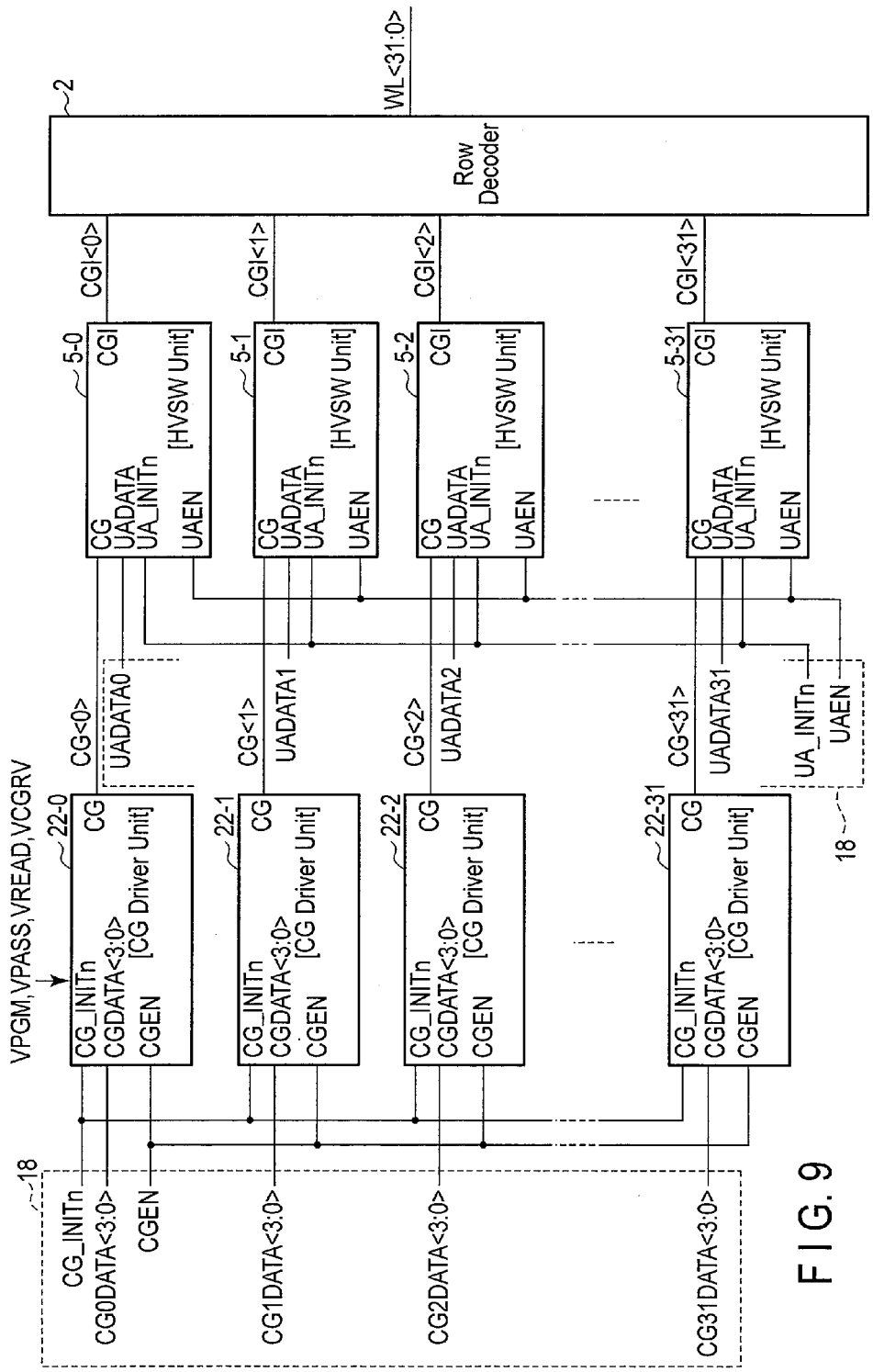
F I G. 9

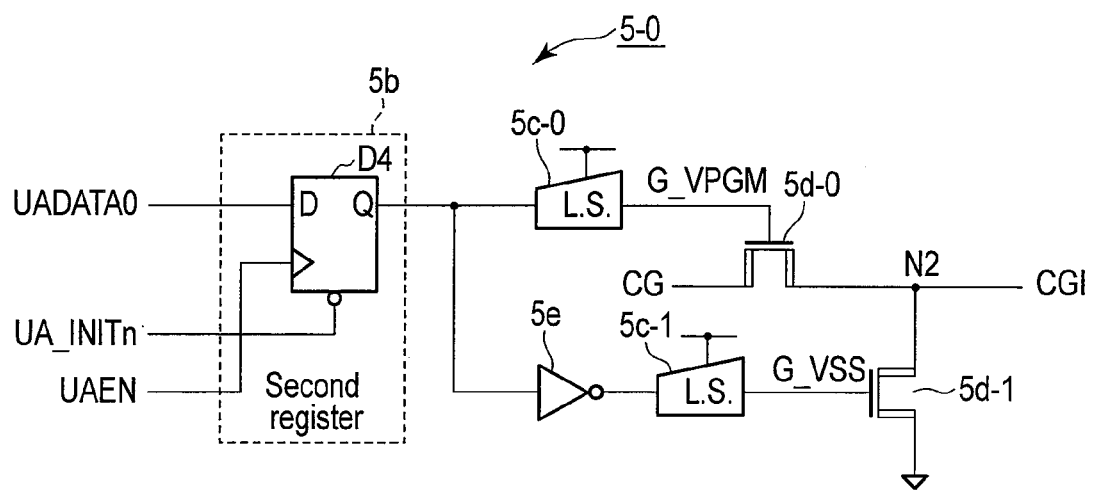
F I G. 11

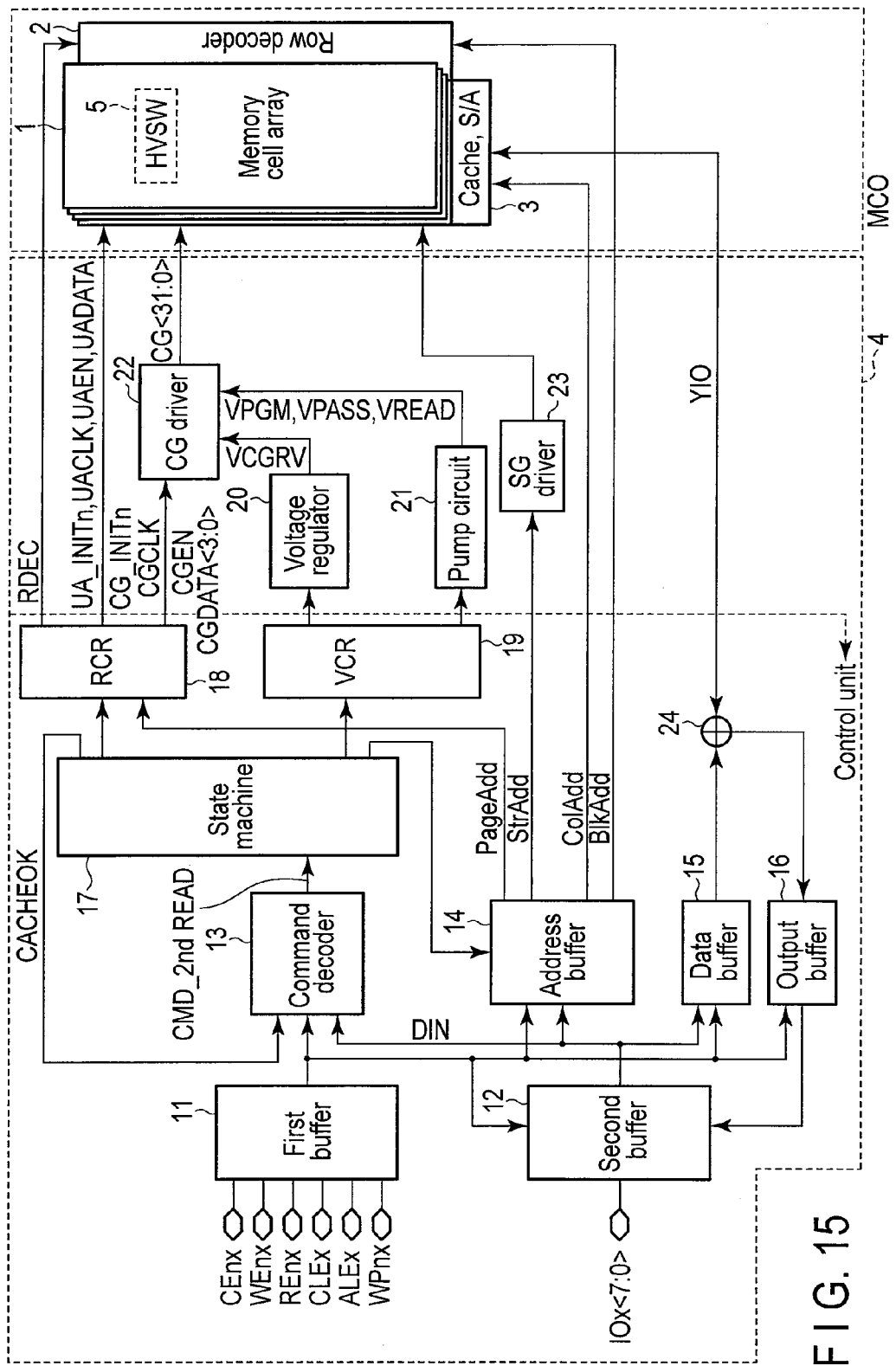
F I G. 15

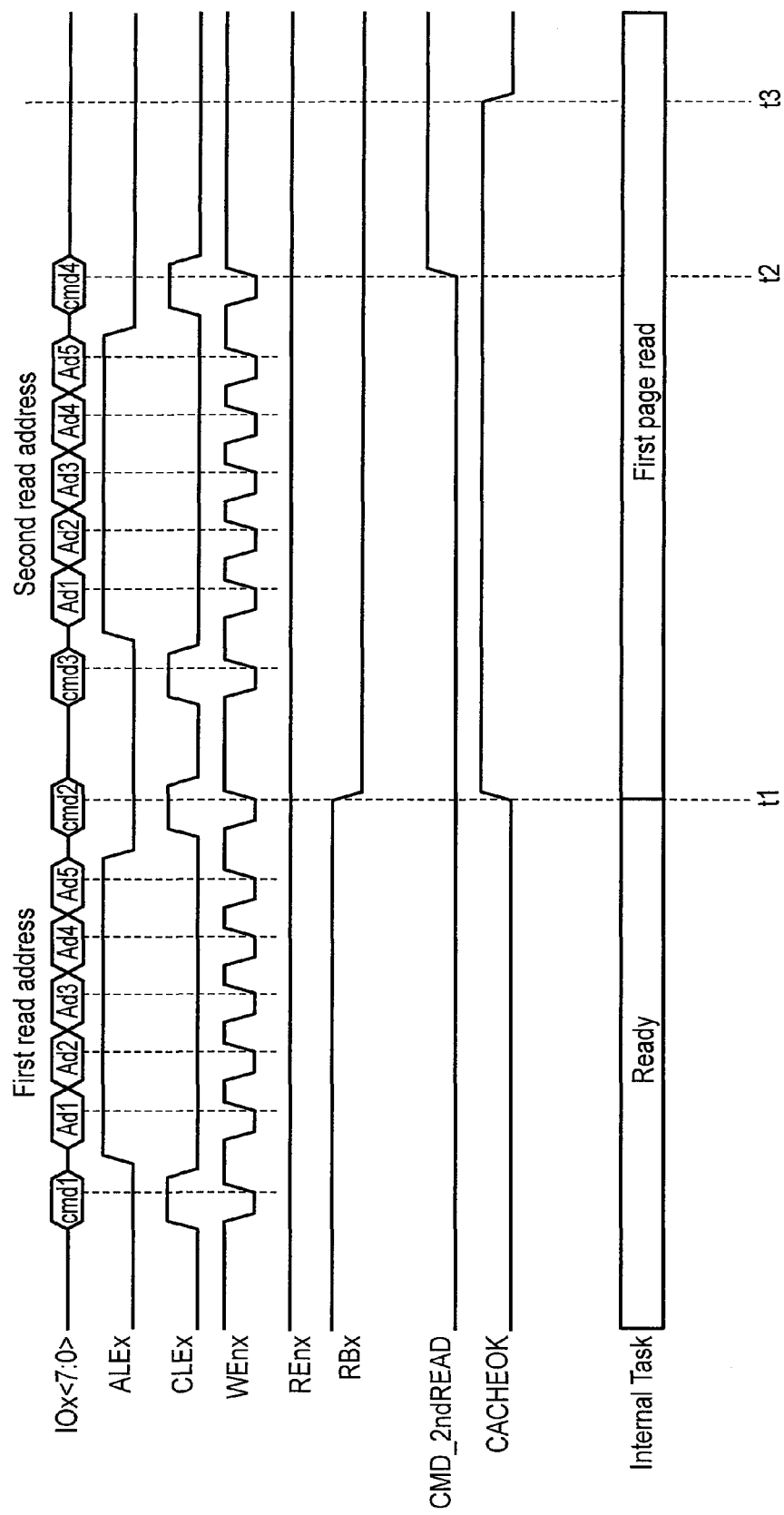
F I G. 16A

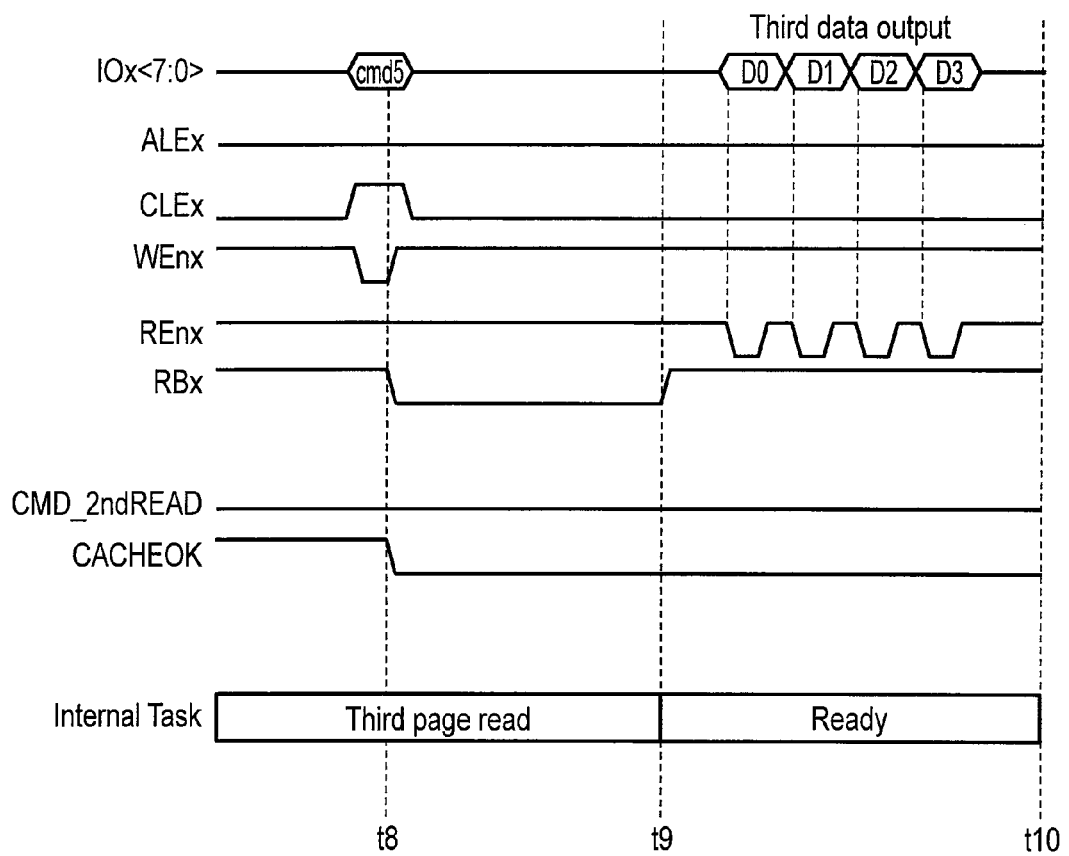
F I G. 16C

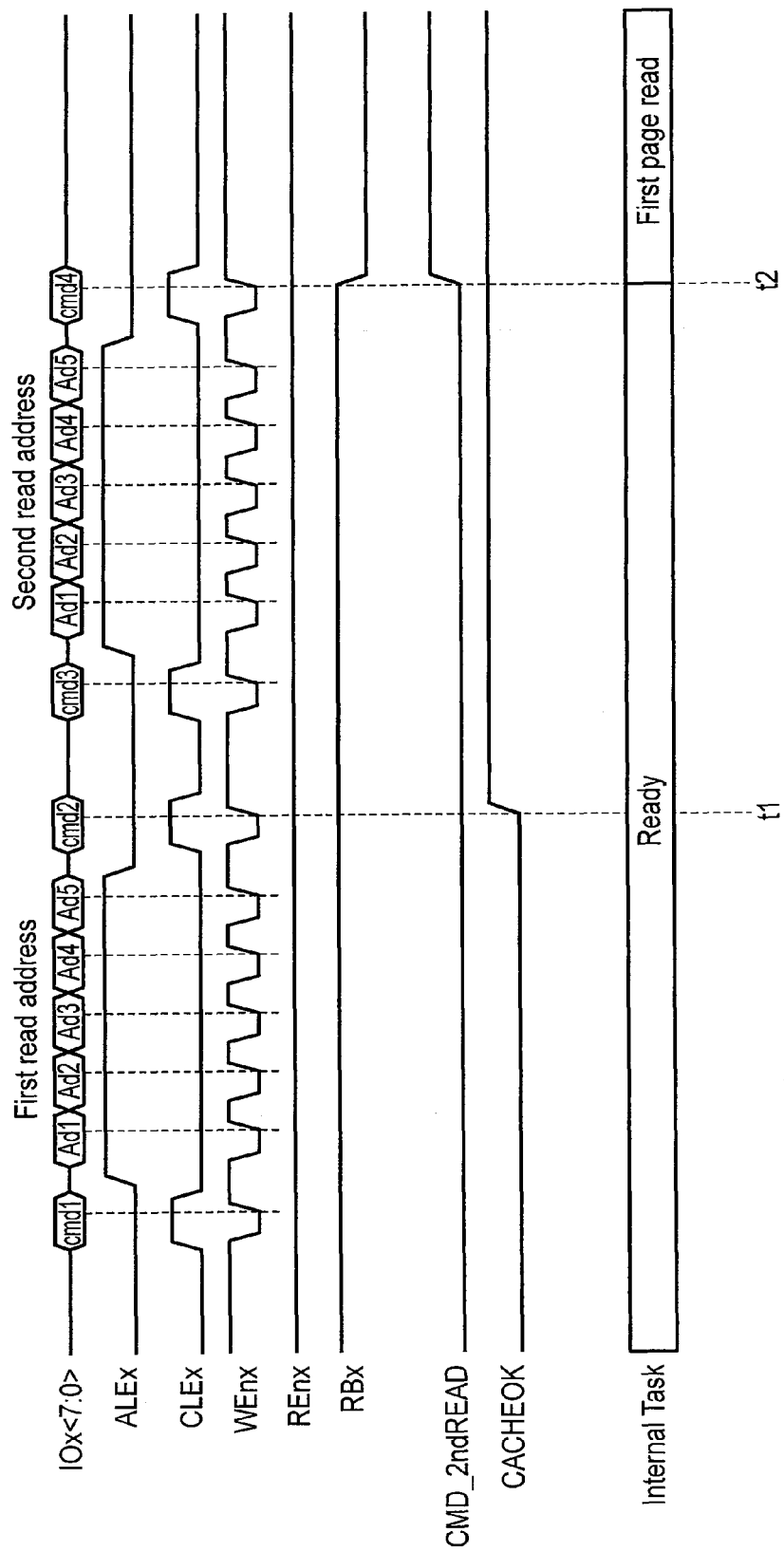
F I G. 17

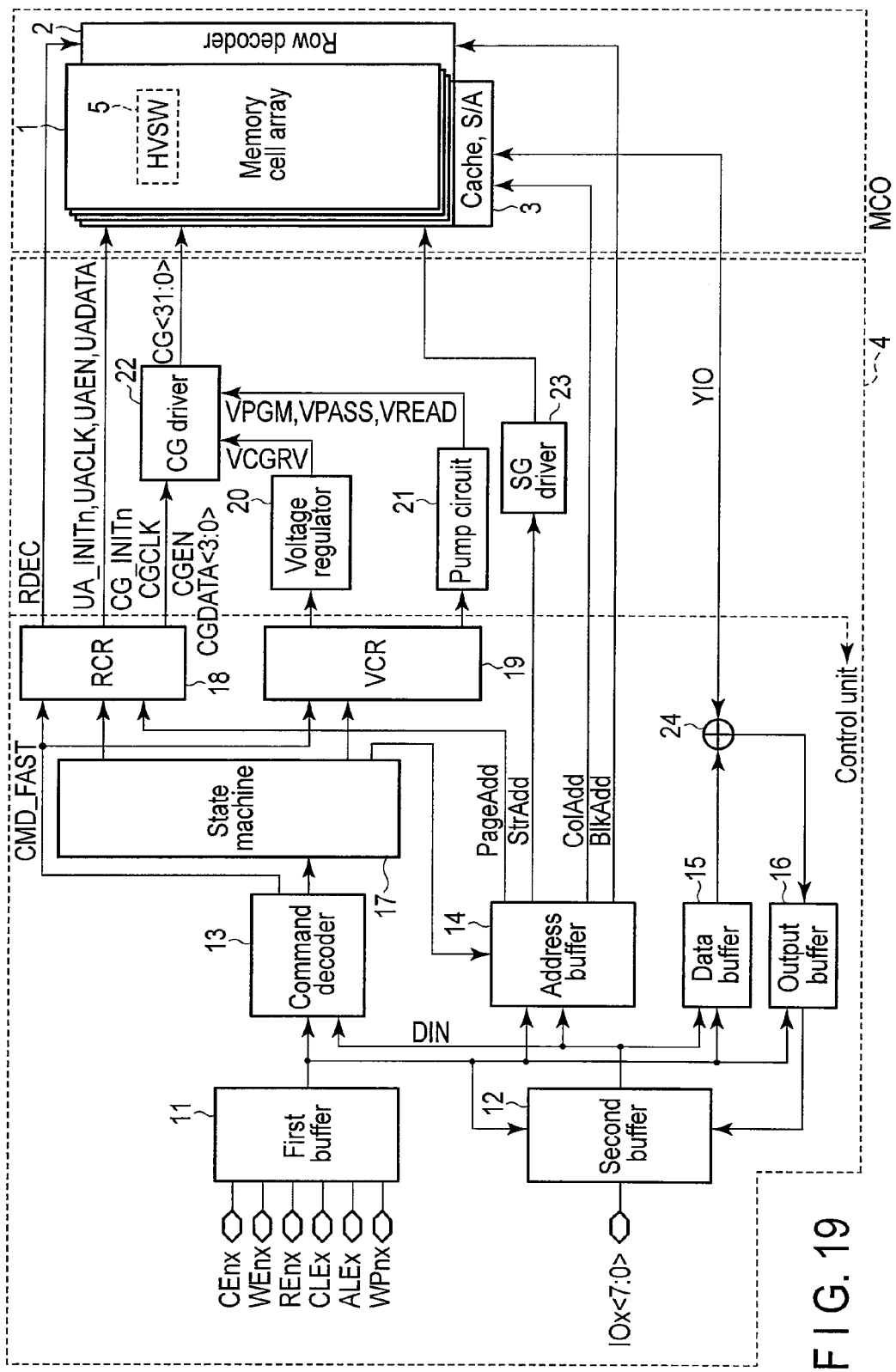
F I G. 19

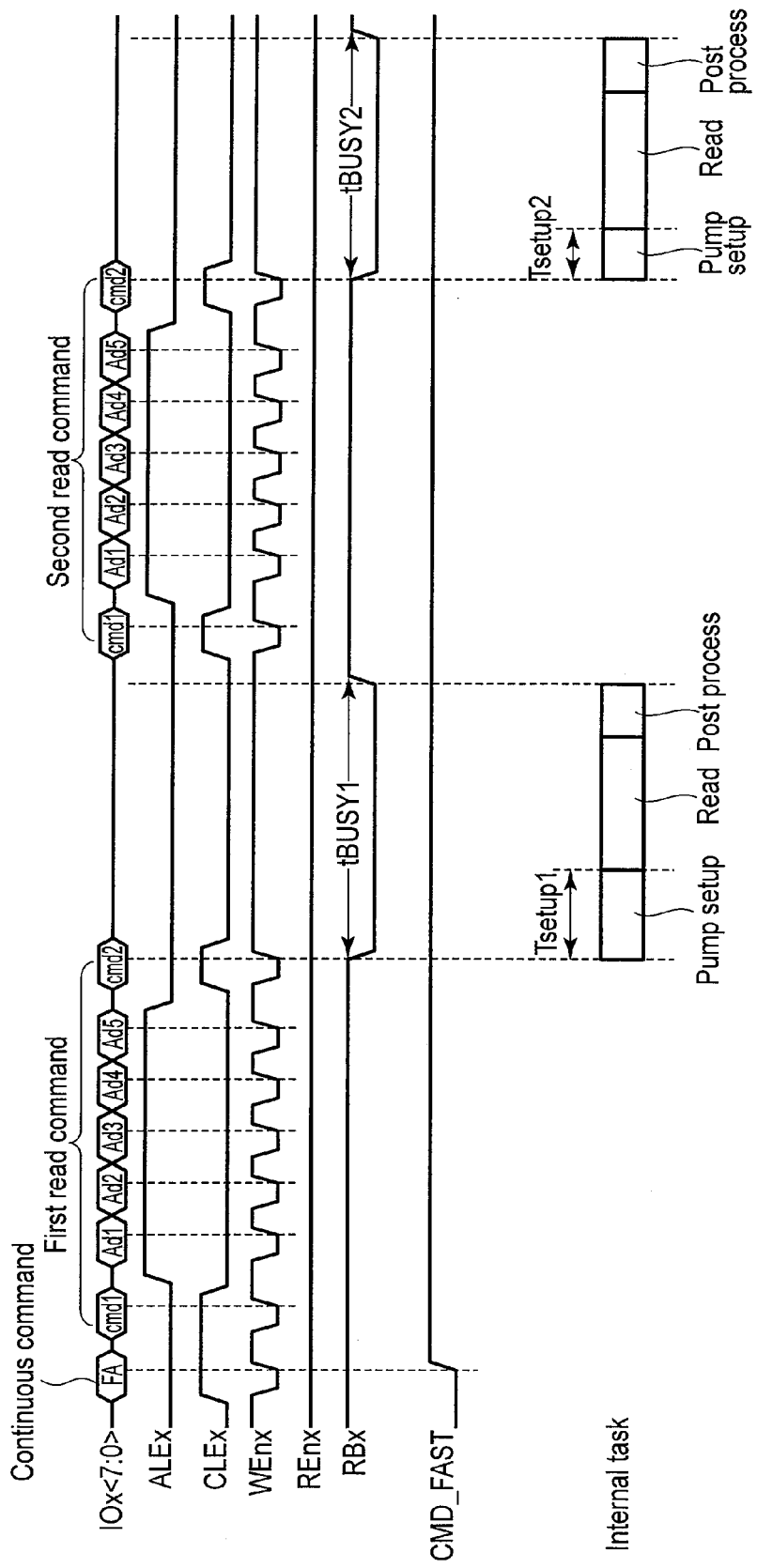
F I G. 21

NON-VOLATILE SEMICONDUCTOR STORAGE DEVICE CAPABLE OF INCREASING OPERATING SPEED

CROSS-REFERENCE TO RELATED APPLICATIONS

This application is based upon and claims the benefit of priority from Japanese Patent Application No. 2013-053499, filed Mar. 15, 2013, the entire contents of which are incorporated herein by reference.

FIELD

Embodiments described herein relate generally to an electrically rewritable non-volatile semiconductor storage device.

BACKGROUND

It is required that the capacity of a non-volatile semiconductor storage device, for example, a NAND flash memory be increased. To meet this requirement, a NAND flash memory with a three-dimensional structure having stacked memory cells is proposed as a way of improving bit density.

BRIEF DESCRIPTION OF THE DRAWINGS

FIG. 1 is a configuration view showing an example of a non-volatile semiconductor storage device applied to a first embodiment;

FIG. 5 is a configuration view showing a connection relation of a control gate driver to a high voltage switch applied to the first embodiment;

FIG. 6 is a configuration view showing the control gate driver and the high voltage switch according to the first embodiment;

FIG. 7 is a circuit diagram showing a configuration of the control gate driver shown in FIG. 6;

FIG. 9 is a circuit diagram showing a modification of the control gate driver and the high voltage switch shown in FIG. 6;

FIG. 11 is a circuit diagram showing a modification of the high voltage switch shown in FIG. 8;

FIG. 15 is a configuration view showing an example of a non-volatile semiconductor storage device according to a third embodiment;

FIG. 16A relates to the third embodiment and is a waveform diagram showing an example of a command sequence;

FIG. 16C is a waveform diagram showing an operation following the operation of FIG. 16B;

FIG. 17 is a waveform diagram showing an example of a command sequence according to a modification of the third embodiment;

FIG. 19 is a configuration view showing an example of a non-volatile semiconductor storage device according to a fifth embodiment;

FIG. 21 is a waveform diagram showing an example of a command sequence of the fifth embodiment.

DETAILED DESCRIPTION

Figure 2:
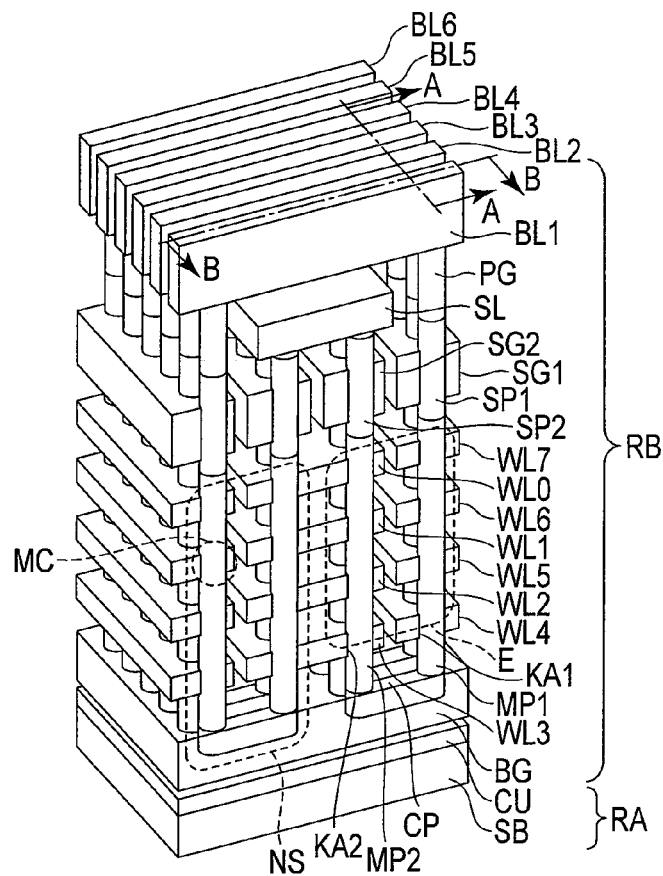
FIG. 2 is a perspective view showing a three-dimensionally stacked structure of the non-volatile semiconductor storage device applied to the first embodiment.

In general, according to one embodiment, a non-volatile semiconductor storage device includes a memory cell array, a row decoder, a potential generating circuit, first plural potential selection circuits, a second potential selection circuit, a first discharge circuit, and a second discharge circuit. The memory cell array includes a plurality of memory cells. A row decoder is connected to the memory cell array. A potential generating circuit is configured to generate a plurality of potentials. A plurality of first potential selection circuits are connected to the potential generating circuit, the first potential generating circuits is capable of selecting one of output potentials of the potential generating circuit by receiving a first control signal and applying the selected output potential to a first signal line. A second potential selection circuit is connected to the first signal line of the first potential selection circuits, the second potential selection circuit is capable of applying a potential of the first signal line to a second signal line connected to the row decoder by receiving a second control signal. A first discharge circuit is arranged in the first potential selection circuit and connected to the first signal line. A second discharge circuit is arranged in the second potential selection circuit and connected to the second signal line.

Embodiments will be explained referring to the drawings. In the following description, "connect to an element" means "connect to an element via another element" as well as "connect to an element directly."

FIG. 1 schematically shows, for example, a three-dimensionally stacked non-volatile semiconductor storage device to which an embodiment of the invention is applied.

The non-volatile semiconductor storage device is configured by a memory core portion (hereinafter, simply called a core portion) MC0 and a peripheral circuit portion 4. The core portion MC0 is configured by a memory cell array 1, a row decoder 2, a cache and sense amplifier (S/A) 3. The memory cell array 1 has a three-dimensionally stacked structure, and the row decoder 2 selects a word line potential and a block. The cache and sense amplifier 3 has a cache for storing write data and read data and a sense amplifier for detecting the potential of a bit line.

The peripheral circuit portion 4 is configured by a first buffer 11, a second buffer 12, a command decoder 13, an address buffer 14, a data buffer 15, an output buffer 16, a state machine 17, a row system control register (RCR) (hereinafter, simply called a control register) 18, a voltage control register (VCR) (hereinafter, simply called a control register) 19, a voltage regulator 20, a charge pump circuit 21 as a booster circuit, a control gate (CG) driver 22 as a first potential selection circuit, a selection gate (SG) driver 23, and a distributor 24.

The first buffer 11 receives information CEnx, WEnx, REnx, CLEx, ALEx and WPnx of various control pins. The information CEnx is a chip enable signal, the information WEnx is a write-enable signal, the information REnx is a read-enable signal, the information CLEx is a command-latch-enable signal, the information ALEx is an address-latch-enable signal, and the information WPnx is a write-protection signal.

The second buffer 12 receives an address, data, a command code and the like from an input/output pin IOx<7:0> and outputs data read from a memory cell to the input/output pin IOx<7:0>.

The command decoder 13 decodes states of the first buffer 11 and the second buffer 12 and generates a necessary command.

The address buffer 14 decodes states of the first buffer 11 and the second buffer 12 and interprets a necessary address.

The data buffer 15 decodes the states of the first buffer 11 and the second buffer 12 and interprets necessary write data.

The output buffer 16 sends read data to the second buffer 12 and selects necessary data.

The state machine 17 interprets a received command and controls read, write, erase and the like.

The control register 18 controls row system circuits of the row decoder 2 and the like under the control of the state machine 17.

The control register 19 controls the voltage regulator 20 and the charge pump circuit 21.

The voltage regulator 20 outputs, for example, a voltage VCGRV based on an output signal of the control register 19.

The charge pump circuit 21 generates, for example, a write selection voltage VPGM, a write non-selection voltage VPASS, and a write-and-verify non-selection voltage VREAD based on an output signal of the control register 19. The SG driver 23 controls a selection gate that configures the memory cell array 1 based on an output signal of the address buffer 14.

The state machine 17 controls the control register 18, and the control register 18 controls the CG driver 22 by an initialization signal CG_INITn, a clock signal CGCLK, data CGDATA<3:0>, and a clock signal CGEN. Initialization signal CG_INITn is a signal for initializing a register in the CG driver 22 to be described later. Clock signal CGCLK is a signal for storing data in the register in the CG driver 22. The data CGDATA<3:0> is data transferred in synchronization with clock signal CGCLK. Clock signal CGEN is a signal for storing data in the register in the CG driver 22.

Further, the control register 18 supplies a signal UA_INITn, a clock signal UACLK, data UADATA, and a clock signal UAEN to a high voltage switch (hereinafter, called a HVSW) 5 as a second potential selection circuit associated with the core portion MC0. Signal UA_INITn initializes the register. Clock signal UACLK is a clock signal when data is stored in the register. The data UADATA changes in synchronization with clock signal UACLK. Clock signal UAEN is necessary when data is stored in a register associated with the HVSW 5.

Configurations and operations of the CG driver (first potential selection circuit) 22 and the HVSW (second potential selection circuit) 5 will be described later.

The selection gate driver 23 controls the selection gate in the memory cell array 1.

The distributor 24 controls a transfer of input/output data.

FIG. 2 shows a schematic arrangement of the memory cell array 1 shown in FIG. 1.

Note that, in FIG. 2, a NAND string NS is formed by returning a memory cell MC in which only four layers are stacked at a lower end and connecting eight memory cells MC in series. However, the number of stacked memory cells and the number of memory cells are not limited to those described above.

In FIG. 2, a semiconductor substrate SB is arranged with a circuit region RA, and a memory cell region RB is arranged on the circuit region RA.

In the circuit region RA, a circuit layer CU is formed on the semiconductor substrate SB. A circuit for configuring the row decoder 2, the cache and sense amplifier 3, and the peripheral circuit portion 4 which are shown in FIG. 1 can be entirely or partly formed in the circuit layer CU. The memory cell array 1 of FIG. 1 can be formed in the memory cell region RB.

Further, in the memory cell region RB, a back gate layer BG is formed on the circuit layer CU, and a connection layer CP is formed on the back gate layer BG. Columnar members MP1 and MP2 are arranged adjacent with each other on the connection layer CP, and lower ends of columnar members MP1 and MP2 are connected with each other via the connection layer CP.

Further, word lines WL3 to WL0 having four layers are sequentially stacked on the connection layer CP, and word lines WL4 to WL7 having four layers are sequentially stacked so as to be adjacent to word lines WL3 to WL0, respectively. The NAND string NS is configured by causing columnar member MP1 to pass through word lines WL4 to WL7 and causing columnar member MP2 to pass through word lines WL0 to WL3.

Further, columnar members SP1 and SP2 are formed on columnar members MP1 and MP2, respectively.

A selection gate SG1 which is passed through by columnar member SP1 is formed above word line WL7 that is an uppermost layer, and a selection gate SG2 which is passed through by columnar member SP2 is formed above word line WL0 that is an uppermost layer.

Further, a source line SL connected to columnar member SP2 is arranged above the selection gate SG2, and bit lines BL1 to BL6 connected to columnar member SP1 via plugs PG are formed to respective columns above the selection gate SG1. Note that columnar members MP1 and MP2 can be arranged at points of intersection of bit lines BL1 to BL6 and word lines WL0 to WL7.

Figure 3:
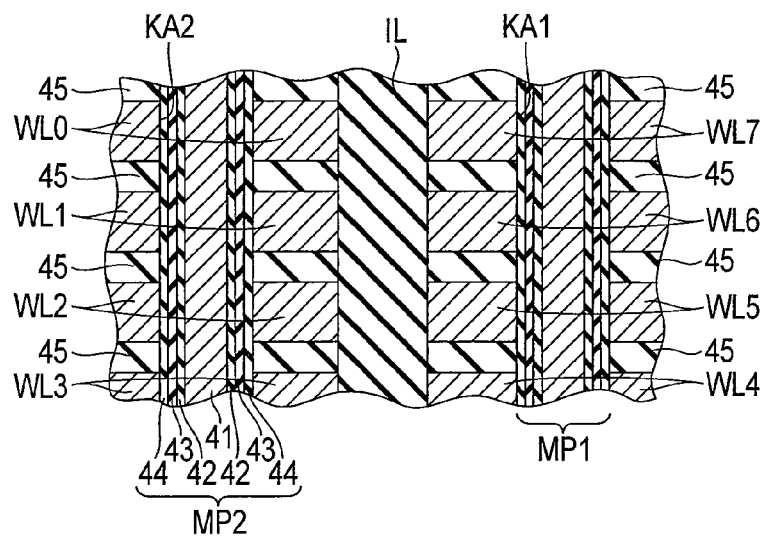
FIG. 3 is a sectional view showing a part of FIG. 2.

FIG. 3 is a sectional view showing a dotted line E portion shown in FIG. 2 in enlargement.

In FIG. 3, an insulator IL is buried between word lines WL0 to WL3 and word lines WL4 to WL7.

An interlayer insulation film 45 is formed between word lines WL0 to WL3 and between word lines WL4 to WL7.

Further, a through-hole KA2, which passes through word lines WL0 to WL3 and interlayer insulation film 45 in a stack direction is, formed to word lines WL0 to WL3 and interlayer insulation film 45, and a through-hole KA1, which passes through word lines WL4 to WL7 and interlayer insulation film 45 in a stack direction, is formed to word lines WL4 to WL7 and interlayer insulation film 45. Columnar member MP1 is formed in through-hole KA1, and columnar member MP2 is formed in through-hole KA2.

Columnar semiconductors 41 are formed at the centers of columnar members MP1 and MP2. Tunnel insulation films 42 are formed between the inner surfaces of through-holes KA1 and KA2 and the columnar semiconductors 41, charge trap layers 43 are formed between the inner surfaces of through-holes KA1 and KA2 and the tunnel insulation films 42, and block insulation films 44 are formed between the inner surfaces of through-holes KA1 and KA2 and the charge trap layers 43.

The columnar semiconductors 41 can be formed using a semiconductor, for example, polysilicon and the like. The tunnel insulation films 42 and the block insulation films 44 can be formed using, for example, a silicon oxide film. The charge trap layers 43 can be formed using, for example, a silicon nitride film or an ONO film (a three-layer-stacked structure of a silicon oxide film, a silicon nitride film, and a silicon oxide film).

Figure 4:
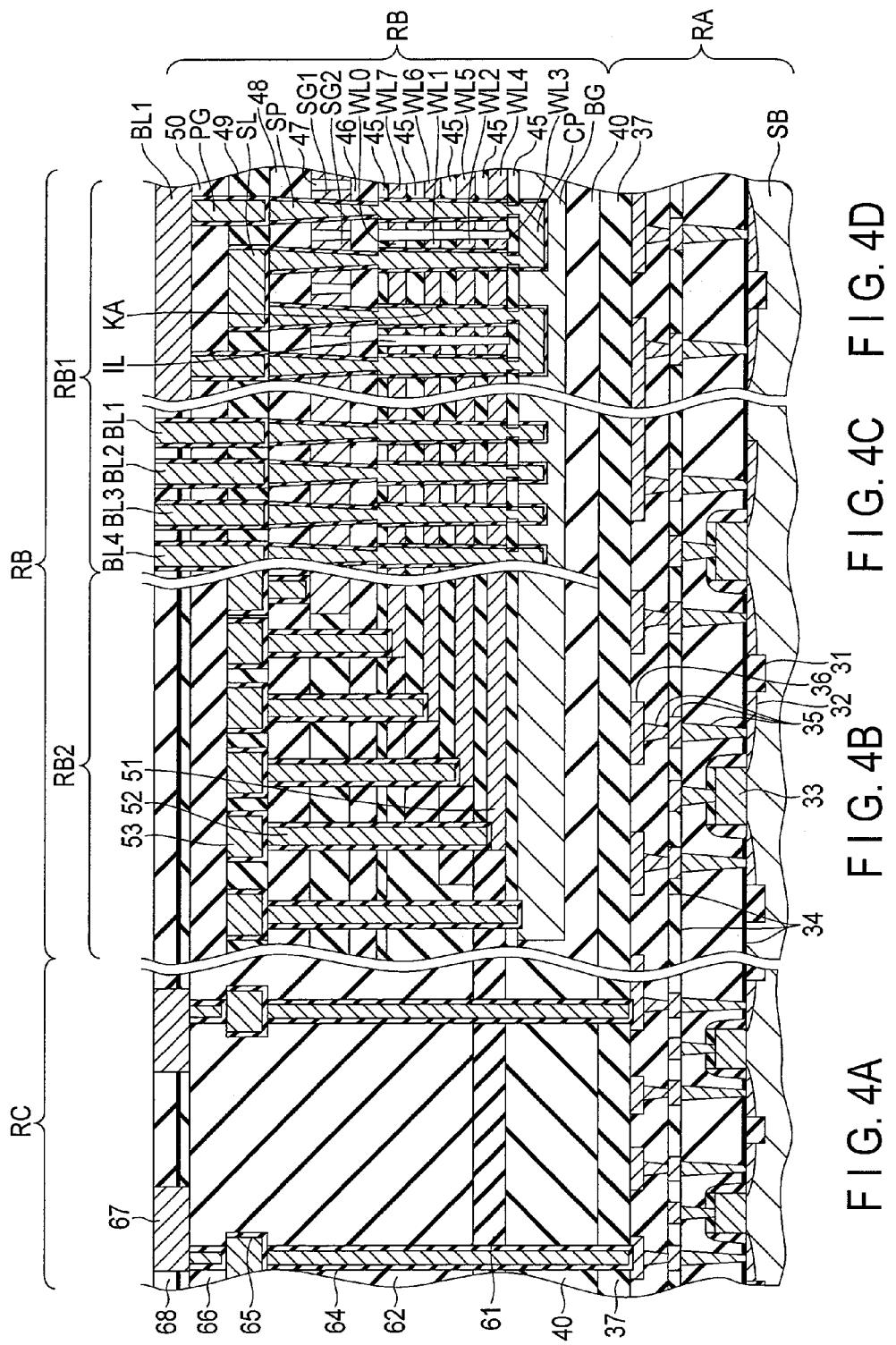
FIG. 4A is a sectional view schematically showing a peripheral circuit portion of the non-volatile semiconductor storage device shown in FIG. 1.
FIG. 4B is a sectional view schematically showing a word line drawing-out portion of the non-volatile semiconductor storage device shown in FIG. 1.
FIG. 4C is a sectional view along line A-A shown in FIG. 2.
FIG. 4D is a sectional view along line B-B of FIG. 2.

FIG. 4A is a sectional view schematically showing the peripheral circuit portion of the non-volatile semiconductor storage device shown in FIG. 1; FIG. 4B is a sectional view schematically showing a word line drawing-out portion of the non-volatile semiconductor storage device shown in FIG. 1; FIG. 4C is a sectional view along line A-A shown in FIG. 2; and FIG. 4D is a sectional view along line B-B of FIG. 2.

In FIG. 4A to FIG. 4D, a peripheral region RC is arranged in a periphery of the memory cell region RB. Note that the circuit region RA can be associated with the peripheral region RC. Further, a memory cell region RB1 and a drawing-out region RB2 are associated with the memory cell region RB. In the circuit region RA, shallow trench isolation (STI) 31 as an element isolation region is formed to the semiconductor substrate SB, diffusion layers 32 are formed in an active region isolated by the STI 31, and gates 33 are arranged on channel regions between the diffusion layers 32, thereby a transistor is formed.

Further, an interlayer insulation film 34 is formed on the semiconductor substrate SB on which the transistor is formed, and a plug 35 and a wiring 36 are buried in interlayer insulation film 34. Interlayer insulation films 37 and 40 are formed on the wiring 36.

Further, in the memory cell region RB1, the back gate layer BG is formed on an interlayer insulation film 40 and the connection layer CP is formed on the back gate layer BG. Word lines WL3 to WL0 are sequentially stacked via interlayer insulation film 45, and word lines WL4 to WL7 are sequentially stacked via interlayer insulation film 45.

Further, the selection gate SG2 is formed on word line WL0 via an interlayer insulation film 46, and the selection gate SG1 is formed on word line WL7 via interlayer insulation film 46. Further, an interlayer insulation film 47 is buried between the selection gates SG1 and SG2.

Further, the source line SL is formed on the selection gate SG2 via an interlayer insulation film 48, and the source line SL is buried by an interlayer insulation film 49. Further, a bit line BL1 is formed on the selection gate SG1 and the source line SL via an interlayer insulation film 50.

Further, in the peripheral region RC, interlayer insulation films 61, 62 and 68 are formed on interlayer insulation film 40. Plugs 64 and 66 and wirings 65 and 67 are buried in interlayer insulation films 37, 40, 61, 62 and 68. The peripheral portion RC shown in FIG. 4 can be caused to correspond the peripheral circuit portion of FIG. 1, and the RB portion of FIG. 4 can be caused to correspond entirely or partly to the core portion MC0 of FIG. 1.

FIG. 5 is a system diagram showing a word line potential transfer system, wherein the same portions as those of FIG. 1 are denoted by the same reference numbers.

The at least one CG driver (first potential selection circuit) 22 associated with the peripheral circuit portion 4 determines the potential of a first word line signal (hereinafter, called a CG line) by selecting one of plural output potentials of the charge pump circuit 2 and the voltage regulator 20 such as write selection voltage VPGM, write non-selection voltage VPASS, read-and-verify selection voltage VCGRV, read-and-verify non-selection voltage VREAD, and the like. An example shown in FIG. 5 shows a case that 32 word lines are employed assuming that 16 layers are stacked. The CG line is drawn to the core portion MC0.

Shown here is an example that two different core portions MC0, i.e., plural blocks ordinarily called plains are arranged and composed of a unit sharing bit lines. Each of the core portions MC0 has the HVSW (second potential selection circuit) 5, and the CG line is divided to plural second word line signals CGI and CGIS (hereinafter, called CGI lines) when necessary for a purpose of dispersing a load. The CGI lines are connected to the row decoder 2 and finally connected to the word lines of the memory cell array.

First Embodiment

FIG. 6 shows configurations of a CG driver 22 as a first potential selection circuit, an HVSW 5 as a second potential selection circuit, and a row decoder 2.

The CG driver 22 is configured by plural CG driver units 22-0 to 22-31, and the HVSW 5 is configured by plural HVSW units 5-0 to 5-31. That is, each of CG driver units 22-0 to 22-31 and each of HVSW units 5-0 to 5-31 are associated with each of CG lines and CGI lines. Shown here is an example that the CG driver units and the HVSW units are composed of 32 units, respectively. Each of CG driver units 22-0 to 22-31 receives a signal CG_INITn, CGCLK, and CGEN output from a control register 18, and a write selection voltage VPGM, a write non-selection voltage VPASS, a read-and-verify non-selection voltage VREAD, and a read-and-verify selection voltage VCGRV which are applied from a pump circuit 21 and a voltage regulator 20 are also commonly input to the respective units. However, in FIG. 6, application of VPGM, VPASS, VREAD and VCGRV to CG driver units 22-1 to 22-31 is omitted.

Further, data lines of CG driver units 22-0 to 22-31 are connected in series. Specifically, an output signal CGDATA<3:0> of the control register 18 is supplied to an input port CGDATA<3:0> of CG driver unit 22-0, and a signal of an output port rCGDATA<3:0> of CG driver unit 22-0 is supplied to an input port CGDATA<3:0> of CG driver unit 22-1. Hereinafter, data lines are connected in series up to an input port of CG driver unit 22-31.

Further, output ports CG<0> to CG<31> of CG driver units 22-0 to 22-31 are connected to input ports CG of HVSW units 5-0 to 5-31 corresponding thereto.

HVSW units 5-0 to 5-31 receive CG signals output from CG driver units 22-0 to 22-31 and signals UA_INITn, UACLK and UAEN output from the control register 18.

Data lines of HVSW units 5-0 to 5-31 are connected in series likewise CG driver units 22-0 to 22-31. Specifically, an output signal UADATA of the control register 18 is supplied to an input port UADATA of HVSW unit 5-0, and an output port rUADATA of HVSW unit 5-0 is connected to an input port UADATA of HVSW unit 5-1. Hereinafter, data lines are connected in series up to an input port of HVSW unit 5-31.

Further, output ports CGI<0> to CGI<31> of HVSW units 5-0 to 5-31 are connected to the row decoder 2, and a predetermined potential is applied to a word line of a block selected via the row decoder 2.

FIG. 7 is a view showing an example of a configuration of, for example, CG driver unit 22-0, and the other CG driver units 22-1 to 22-31 have the same configuration as that of CG driver unit 22-0.

CG driver unit 22-0 is configured by a first register 22a, a second register 22b, plural level shifters (L.S.) 22c-0 to 22c-4, plural N-channel MOS transistors 22d-0 to 22d-4, and a NOR gate 22e. The first register 22a is configured by plural flip-flop circuits D1-0 to D1-3, and the second register 22b is configured by plural flip-flop circuits D2-0 to D2-3. N-channel MOS transistors 22d-0 to 22d-4 have higher break down voltage than that of a transistor in the memory cell array 1.

Output signal CGDATA<3:0> of the control register 18 is supplied to data terminals D of flip-flop circuits D1-0 to D1-3 which configure the first register 22a, clock signal CGCLK is supplied to clock terminals of flip-flop circuits D1-0 to D1-3, and signal CG_INITn is supplied to an initialization reset terminal.

Output signal rCGDATA<3:0> of flip-flop circuits D1-0 to D1-3 is supplied to data terminals D of flip-flop circuits D2-0 to D2-3 which configure the second register 22b. Further, an output signal CGEN of the control register 18 is supplied to clock terminals of flip-flop circuits D2-0 to D2-3, and signal CG_INITn is supplied to initialization reset terminals of flip-flop circuits D2-0 to D2-3. Output signals of flip-flop circuits D2-0 to D2-3 are supplied to level shifters 22c-0 to 22c-3 and supplied to the NOR gate 22e. An output signal of the NOR gate 22e is supplied to a level shifter 22c-4.

Level shifters 22c-0 to 22c-3 shift levels of output signals of the second register 22b to voltages G_VPGM, G_VCGRV, G_VPASS and G_VREAD which are higher than write selection voltage VPGM, voltage VCGRV, write non-selection voltage VPASS, and read-and-verify non-selection voltage VREAD by a threshold voltage of the N-channel MOS transistor, respectively. Output voltages G_VPGM, G_VCGRV, G_VPASS and G_VREAD of level shifters 22c-0 to 22c-3 are applied to the gates of N-channel MOS transistors 22d-0 to 22d-3, respectively. One end of each of the current paths (source/drain) of transistors 22d-0 to 22d-3 has write selection voltage VPGM, voltage VCGRV, write non-selection voltage VPASS, and read-and-verify non-selection voltage VREAD applied, and the other ends thereof are connected to a common connection node N1. A voltage CG is output from the common connection node N1. Transistors 22d-0 to 22d-3 select one of write selection voltage VPGM, voltage VCGRV, write non-selection voltage VPASS, and read-and-verify non-selection voltage VREAD according to the output voltages of level shifters 22c-0 to 22c-3 and output the selected voltage as voltage CG.

Further, level shifter 22c-4 shifts the output voltage of the NOR gate 22e to a voltage G_VSS. Voltage G_VSS is the voltage necessary to discharge a CG line via N-channel MOS transistor 22d-4 and is applied to the gate of N-channel MOS transistor 22d-4 used for discharge. One end of the current path of transistor 22d-4 is connected to the common connection node N1, and the other end thereof is grounded. When all the output signals of flip-flop circuits D2-0 to D2-3 which configure the second register 22b are low, transistor 22d-4 discharges the common connection node N1.

Figure 8:
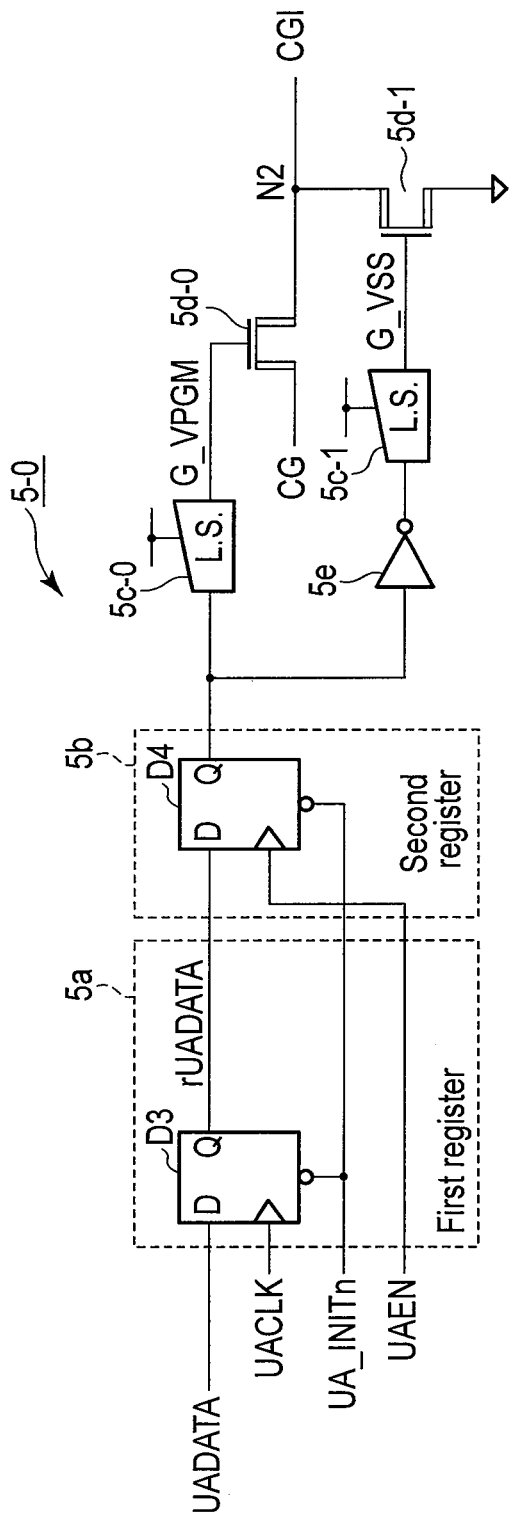
FIG. 8 is a circuit diagram showing a configuration of the high voltage switch shown in FIG. 6.

FIG. 8 shows a configuration example of HVSW unit 5-0 as the second potential selection circuit. The other HVSW units 5-1 to 5-31 have the same configuration as that of HVSW unit 5-0.

HVSW unit 5-0 is configured by a flip-flop circuit D3 which configures a first register 5a, a flip-flop circuit D4 which configures a second register 5b, level shifters 5c-0, 5c-1, N-channel MOS transistors 5d-0, 5d-1, and an inverter circuit 5e.

A signal UDATA output from the control register 18 is input to a data terminal D of flip-flop circuit D3, a signal UACLK is supplied to a clock terminal of flip-flop circuit D3, and signal UA_INITn is supplied to an initialization reset terminal of flip-flop circuit D3.

A signal rUADATA output from an output terminal Q of flip-flop circuit D3 is supplied to a data terminal D of flip-flop circuit D4 which configures a second register 5b, a signal UAEN output from the control register 18 is supplied to a clock terminal of flip-flop circuit D4, and signal UA_INITn is supplied to the initialization reset terminal.

A signal output from an output terminal Q of flip-flop circuit D4 is supplied to level shifter 5c-0 and supplied to level shifter 5c-1 via the inverter circuit 5e. Level shifter 5c-0 shifts the output voltage of flip-flop circuit D4 to voltage G_VPGM and applies the shifted output voltage to the gate of transistor 5d-0. One end of the current path of transistor 5d-0 is has voltage CG applied to it, and the other end thereof is connected to a common connection node N2. Transistor 5d-0 outputs voltage CG as a voltage CGI according to voltage G_VPGM.

Further, level shifter 5c-1 shifts a high voltage applied by the inverter circuit 5e to, for example, voltage G_VPGM and supplies the shifted high signal to the gate of transistor 5d-1. One end of the current path of transistor 5d-1 is connected to the common connection node N2, and the other end thereof is grounded. When the output signal of the second register 5b is low, transistor 5d-1 discharges the common connection node N2.

In the first embodiment, the second register 5b in the HVSW 5, transistor 5d-1 for selecting a discharge potential, the inverter circuit 5e for selecting transistor 5d-1, and level shifter 5c-1 are provided as the second potential selection circuit.

A two-dimensional non-volatile semiconductor storage device will be examined as a comparative example. In the comparative example, although a CG driver 22 as a first potential selection circuit is arranged in a peripheral circuit portion 4, an HVSW 5 as a second potential selection circuit is not arranged or even if the HVSW 5 is arranged, only a transistor as a switch for transmitting a minimum necessary potential of a CG line to a CGI line is arranged. Accordingly, a transistor for discharging an electric charge of a connection node is not provided.

In contrast, in the first embodiment, transistor 5d-1 for discharging the electric charge of the common connection node N2 is provided, and further whether the potentials of the CG lines are individually transmitted or discharged can be controlled to the 32 CGI lines. Accordingly, as the capacity of the non-volatile semiconductor storage device is increased, the read time can be reduced.

<Modification FIG. 6>

FIG. 9 is a modification of the configuration shown in FIG. 6, and, in FIG. 9, the same portions as those of FIG. 6 are denoted by the same reference numbers and an explanation thereof is omitted.

In FIG. 6, the CG driver 22 connects CG driver units 22-0 to 22-31 in series to set the CGDATA<3:0> to CG driver units 22-0 to 22-31, and the HVSW 5 connect HVSW units 5-0 to 5-31 in series to set the UADATA 0-31 to HVSW units 5-0 to 5-31.

In contrast, in the modification shown in FIG. 9, CG0DATA<3:0> to CG31DATA<31:0> are directly input to CG driver units 22-0 to 22-31, and UADATA0 to UADATA31 are directly input to HVSW units 5-0 to 5-31. Accordingly, CG driver units 22-0 to 22-31 are not connected in series and HVSW units 5-0 to 5-31 are not also connected in series.

Specifically, an initialization signal CG_INITn as an output signal of a control register 18 and a clock signal CGEN are supplied to CG driver units 22-0 to 22-31, and control signals CG0DATA<3:0> to CG31DATA<3:0> necessary to individually control CG driver units 22-0 to 22-31 are individually supplied to CG driver units 22-0 to 22-31. The control signals CG0DATA<3:0> to CG31DATA<3:0> are set to registers corresponding to CG driver units 22-0 to 22-31 by a clock signal CGEN.

According to the modification shown in FIG. 9, since it is not necessary to transfer output signals from the respective CG driver units to subsequent CG driver units different from the example shown in FIG. 6 and since the control signals CG0DATA<3:0> to CG31DATA<3:0> are directly supplied from the control register 18 to the respective CG driver units, a clock signal CGCLK becomes unnecessary. Accordingly, a circuit can be configured easily.

Further, as to the HVSW 5 as a second potential selection circuit, the control data UADATA0 to UADATA31 output from the control register 18 are directly supplied to HVSW units 5-0 to 5-31 likewise. Accordingly, it is not necessary to transfer the control data UADATA from the respective HVSW units to subsequent HVSW units, it is not necessary to supply clock signal UACLK to the respective HVSW units, and respective HVSW units 5-0 to 5-31 are controlled by signals UAEN and UA_INITn supplied from the control register 18. Accordingly, a circuit can be more easily configured than the example shown in FIG. 6.

<Modification of FIG. 7>

Figure 10:
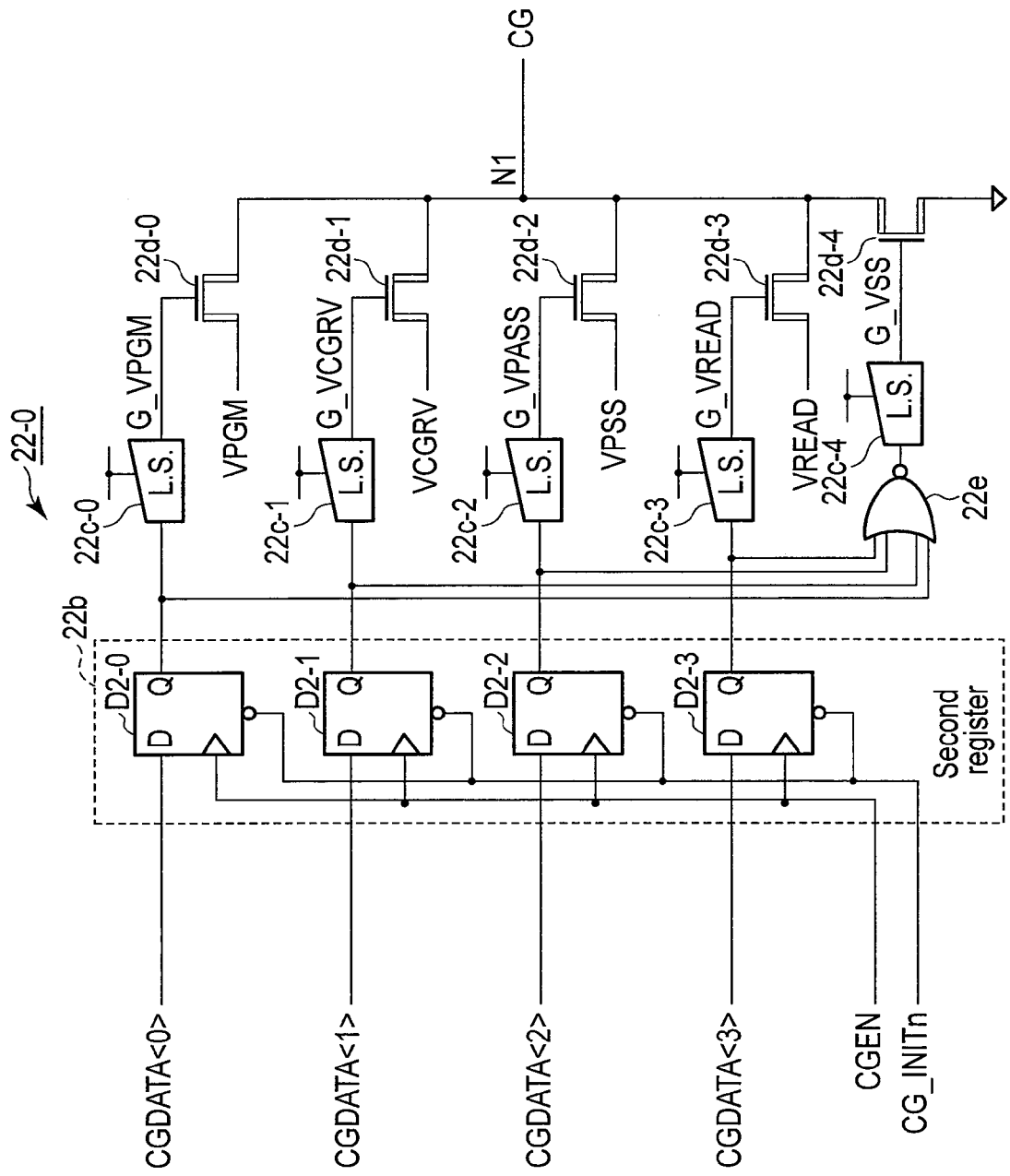
FIG. 10 is a circuit diagram showing a modification of the control gate driver shown in FIG. 7.

FIG. 10 shows a modification of the configuration shown in FIG. 7, and in FIG. 10, the same portions as those of FIG. 7 are denoted by the same reference numbers, and an explanation thereof is omitted.

A CG driver unit 22-0 shown in FIG. 10 is configured by eliminating the first register 22a from CG driver unit 22-0 shown in FIG. 7. That is, it is necessary for CG driver unit 22-0 shown in FIG. 7 to transfer the control data CGDATA<3:0> serially. However, in CG driver unit 22-0 shown in FIG. 10, since the control data CGDATA<3:0> is directly supplied to flip-flop circuits D2-0 to D2-3 of a second register, the first register 22a becomes unnecessary.

According to the modification shown in FIG. 10, the first register 22a can be omitted from the circuit shown in FIG. 7. Accordingly, the circuit configuration can be simplified and operation can be executed at high speed.

<Modification of FIG. 8>

FIG. 11 shows a modification of FIG. 8, and, in FIG. 11, the same portions as those of FIG. 8 are denoted by the same reference numbers, and an explanation thereof is omitted.

An HVSW unit 5-0 shown in FIG. 11 is configured by eliminating the first register 5a from HVSW unit 5-0 shown in FIG. 8. That is, it is necessary for HVSW unit 5-0 shown in FIG. 8 to transfer the control data UADATA serially. However, in HVSW unit 5-0 shown in FIG. 11, since control data UADATA is directly supplied to a flip-flop circuit D4 of a second register 5b, the first register 5a becomes unnecessary.

In the modifications of the first embodiment shown in FIG. 9 to FIG. 11, when the number of CG and CGI lines is increased, although the control signals CG0DATA<3:0> to CG31DATA<3:0> output from the control register 18 and the number of signal lines for transferring the control signals is increased, since a time for transferring the control signals can be reduced, an operating speed can be improved.

<Explanation of Operation>

Figure 12:
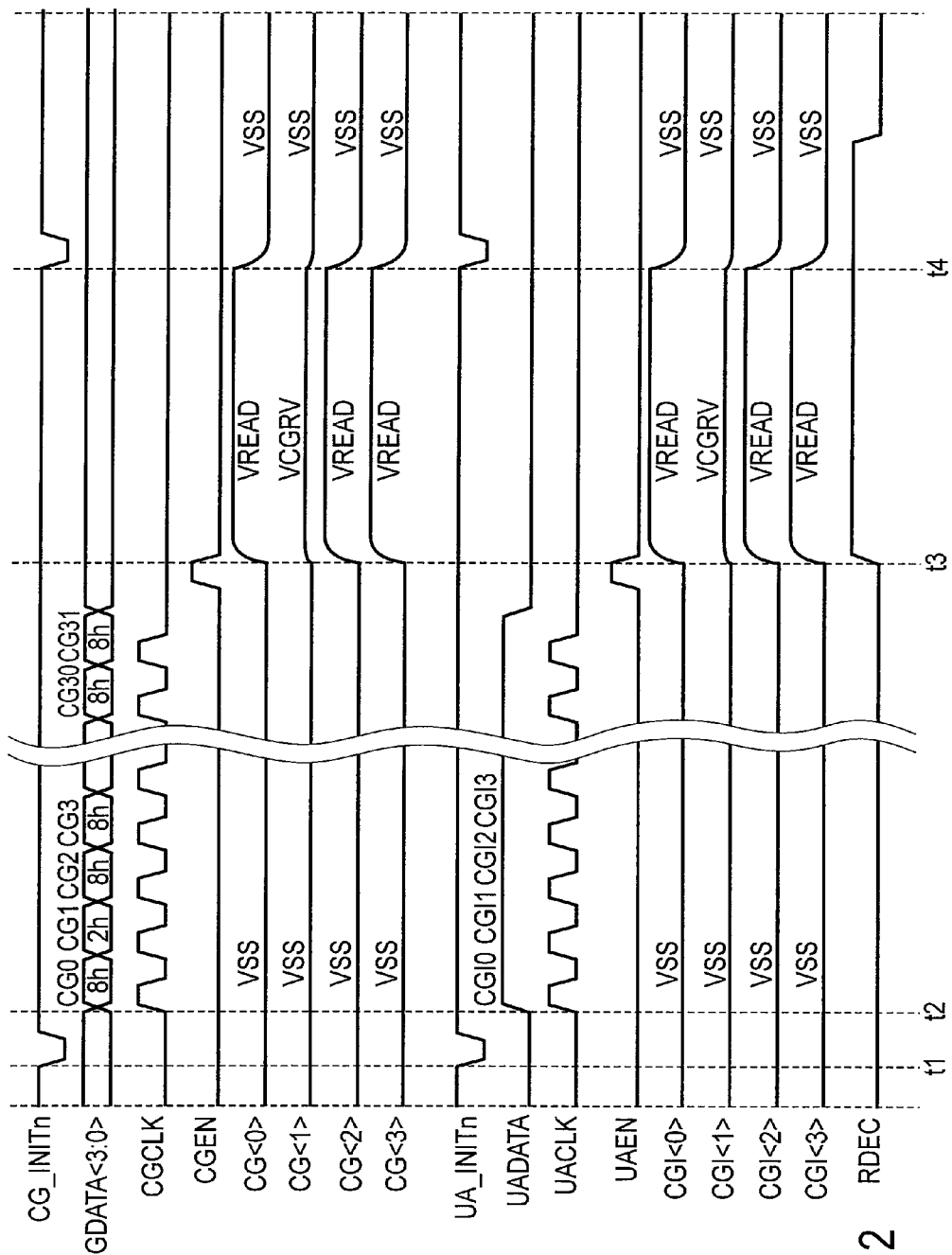
FIG. 12 is a waveform diagram for explaining an operation of the first embodiment.

FIG. 12 shows operations of the CG driver 22 and the HVSW 5 according to the first embodiment and is a waveform diagram showing operations of the circuits shown in, for example, FIG. 6 to FIG. 8. Note that the views showing the waveforms of FIG. 12 and thereafter typically show CG<0> to CG<3>.

The example assumes a read operation of the non-volatile semiconductor storage device, and it is assumed that a command for instructing a not shown read operation is externally supplied to the device, the non-volatile semiconductor storage device interprets the command, and the operations shown in FIG. 12 are executed during a series of operations according to a predetermined read operation.

At a time t1, signals CG_INITn and UA_INITn are asserted. Specifically, the potentials of signals CG_INITn and UA_INITn are made, low once. At the time, the first register 22a and the second register 22b associated with the CG driver 22 and the first register 5a and the second register 5b associated with the HVSW 5 are initialized and the CG line and the CGI line are set to a discharge potential VSS.

Next, from a time t2, the predetermined control data CGDATA<3:0> is supplied to the CG driver 22 to apply a predetermined potential to the CG line, and clock signal CGCLK is supplied to the CG driver 22 in synchronization with the application of the predetermined potential. In the embodiment, word line WL1 is set to a selection word line for read, and the word lines other than word line WL1 are set as non-selected word lines. Accordingly, as to CGDATA<3:0>, 2h (where "h" indicates a hexadecimal number) is set to a CG line <1>, and 8h is placed on CG lines <0>, <2>, and <3> expecting that a selection potential VCGRV is applied to word line WL1 and a non-selection potential VREAD is applied to the word lines other than word line WL1.

Further, to apply a predetermined potential to the CGI line, the predetermined control data UADATA is supplied to the HVSW 5, and clock signal UACLK is supplied in synchronization with the supply of the predetermined control data UADATA. In the example, since all the CGI lines must be set to the same potential as that of the CG line, the control data UADATA is entirely set to high data.

After the first register 22a in the CG driver 22 and the first register 5a in the HVSW 5 have received the data, clock signal CGEN is asserted to transfer data from the first register 22a in the CG driver 22 to the second register 22b. Further, clock signal UAEN is asserted to transfer data from the first register 5a in the HVSW 5 to the second register 5b.

In the example, at a time t3, the transfer operation of the control data is completed on the falling edges of signals CGEN and UAEN. Together with the above operation, from time t3, CG lines CG <0> to CG <3> of respective CG driver units 22-0 to 22-31 are set to voltages VREAD, VCGRV, VREAD and VREAD based on the control data CGDATA<3:0>.

Further, also in respective HVSW units 5-0 to 5-31, from time t3, CGI lines CGI <0> to CGI <3> of respective HVSW units 5-0 to 5-31 are set to voltages VREAD, VCGRV, VREAD and VREAD based on the control data UADATA.

Together with the above operation, at time t3, the row decoder 2 is enabled by making a signal RDEC high, and the data read operation is executed.

Note that although the explanation has been made assuming that the CG driver 22 and the HVSW 5 are operated at the same time, it is not necessary to operate the CG driver 22 and the HVSW 5 at the same time at all times.

Further, in the modifications of the first embodiment shown in FIG. 9 to FIG. 11, at, for example, time t3, the control data CG0DATA<3:0> to CG31DATA<3:0> are directly set to the second registers 22b of respective CG driver units 22-0 to 22-31 and the control data UADATA 0 to UADATA 31 are directly set to the second registers 5b of respective HVSW units 5-0 to 5-31. With the operations, at time t3, a predetermined voltage shown in FIG. 12 is output to the CG line and the CGI line, the row decoder 2 is enabled by signal RDEC, and the data read operation is executed.

In contrast, at a time t4, when the read operation has completed and it has become unnecessary to apply read non-selection potential VREAD and read selection potential VCGRV to all the CG lines including the word line, initialization signals CG_INITn and UA_INITn are asserted. Specifically, initialization signals CG_INITn and UA_INITn are made low once, and the first register 22a and the second register 22b associated with the CG driver 22 and the first register 5a and second register 5b associated with the HVSW 5 are initialized. Accordingly, transistor 22d-4 of the CG driver 22 and transistor 5d-1 of the HVSW 5 are turned on. Thus, the CG line is discharged via transistor 22d-4, and the CGI line is discharged via transistor 5d-1.

Although the operation has been explained as to the read of data as an example, the same operation is executed also when data is written, and a predetermined voltage is applied to a selected word line and to a non-selected word line. Further, when the write operation has been completed, the CG and CGI lines are discharged.

According to the first embodiment, transistor 22d-4 is arranged in respective CG driver units 22-0 to 22-31 to discharge connection node N1 to which the CG line is connected, and transistor 5d-1 is arranged in respective HVSW units 5-0 to 5-31 to discharge connection node N2 to which the CGI line is connected.

In, for example, the two-dimensional NAND flash memory (used as a comparative example), a transistor for discharging the CGI line is not arranged in the HVSW 5, and all the CG lines including the word line are discharged by a transistor associated with the CG driver 22. Accordingly, a large transistor must be provided to increase the discharge capability of the transistor in the CG driver 22.

However, in the first embodiment, since transistor 5d-1 for discharge is arranged in respective HVSW units 5-0 to 5-31 in order to spread the load, the size of transistor 22d-4 in the CG driver 22 can be reduced more than in the comparative example and the CG line and the CGI line can be discharged at high speed.

Further, even when an electric charge amount for charging the word line to which the plural memory cells are connected is increased, a time necessary from a start of charge of the word line to a stabilization of the charge and the time necessary from the start of discharge to the stabilization of the discharge can be reduced. In particular, this is effective when the load capacity of the word line is increased by increasing the capacity of the non-volatile semiconductor storage device, and, for example, the read time can be reduced.

Further, according to the modifications of the first embodiment shown in FIG. 9 to FIG. 11, CG driver units 22-0 to 22-31 are not provided with the first register 22a, HVSW units 5-0 to 5-31 are not provided with the first registers 5a, the control data CGDATA<3:0> is directly set to the second register 22b of CG driver units 22-0 to 22-31, and the control data UADATA is directly set to the second register 5b of HVSW units 5-0 to 5-31. Accordingly, a time for setting the control data CGDATA<3:0>, UADATA to the second registers 22b, 5b can be reduced. That is, since a setting time of the control data can be also reduced in addition to the high-speed operation, it is possible to increase the overall operating speed.

Second Embodiment

Figure 13:
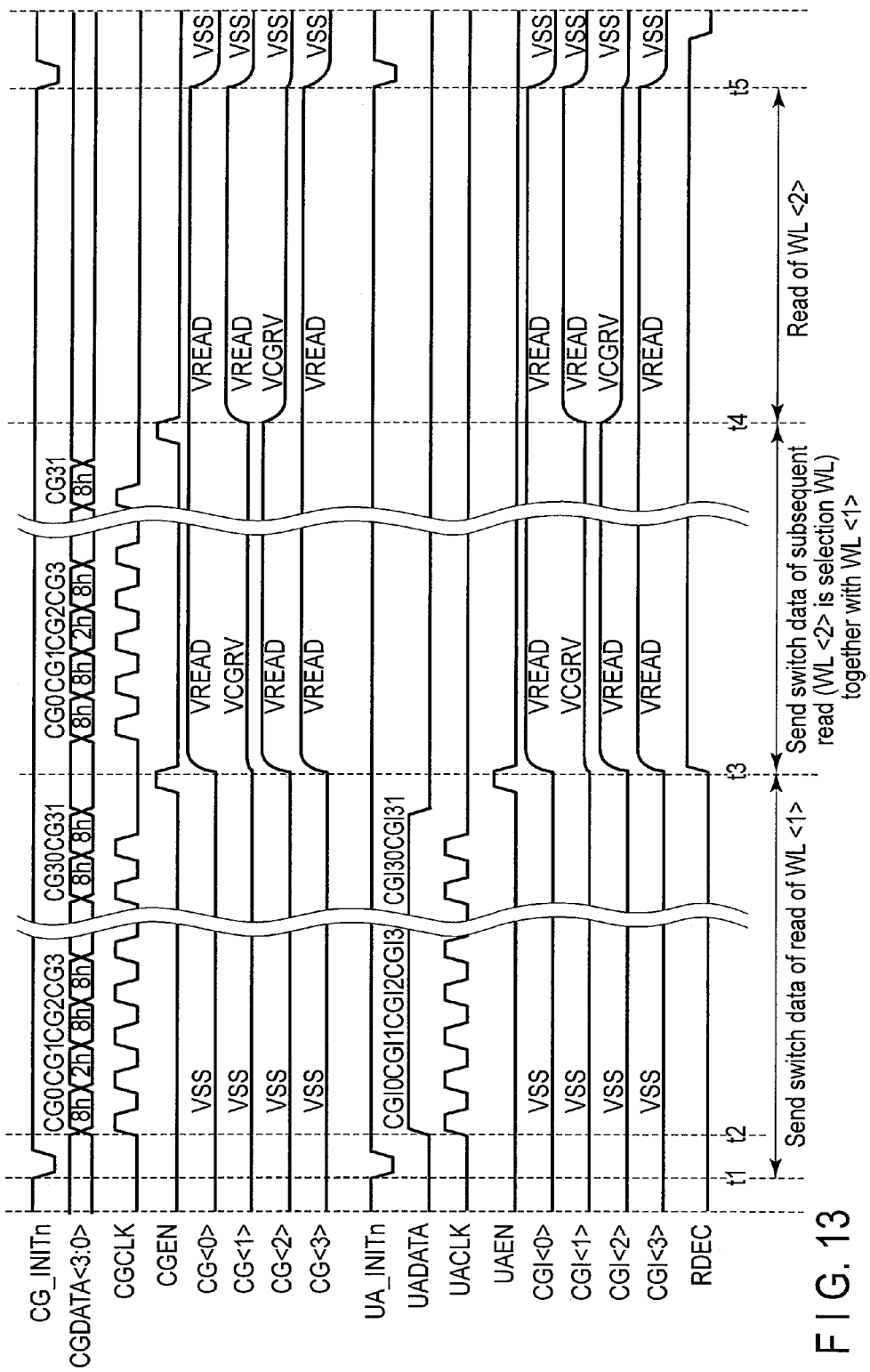
FIG. 13 is a waveform diagram for explaining an operation of a second embodiment.

FIG. 13 relates to a second embodiment and shows a waveform diagram for explaining operations of a CG driver 22 and a HVSW 5.

The second embodiment assumes a cache read in a read operation executed by a non-volatile semiconductor storage device. The cache read is an operation for reading subsequent data while data is being output. With the operation, data can be continuously read.

As described, the CG driver 22 is configured by first and second registers 22a and 22b, and the HVSW 5 is also configured by first and second registers 5a and 5b. That is, in the CG driver 22 and the HVSW 5, the first and second registers configure a so-called double buffer. Accordingly, when the read operation is executed using control data held in the second registers 22b and 5b, since the first registers 22a and 5a can receive control data for a subsequent read operation, the cache read can be executed.

As described later, it is assumed that an operation shown in FIG. 13 is executed during a period in which a command for instructing the read operation is externally supplied and the non-volatile semiconductor storage device interprets the command and executes a series of operations according to a predetermined read operation.

As shown in FIG. 13, at time t1, initialization signals CG_INITn and UA_INITn are made, for example, low once and activated. At the time, the first register 22a and the second register 22b arranged to the CG driver 22 and the first register 5a and the second register 5b arranged to the HVSW 5 are initialized and a CG line and a CGI line are set to a discharge potential VSS.

Next, at a time t2, to apply a predetermined potential to the CG line, control data CGDATA<3:0> is supplied to the CG driver 22, and a clock signal CGCLK is supplied in synchronization with the supply of the control data CGDATA<3:0>. In the embodiment, a word line WL1 is set as a selected word line for read, and the word lines other than word line WL1 are set as non-selected word lines. Accordingly, as to the control data CGDATA<3:0>, 2h is placed on a CG line <1>, and 8h is placed on CG lines, <0>, <2>, and <3> expecting that a selection potential VCGRV is applied to word line WL1 and a non-selection potential VREAD is applied to the word lines other than word line WL1.

Further, to apply a predetermined potential to the CGI line, predetermined control data UADATA is supplied to the HVSW 5, and a clock signal UACLK is supplied in synchronization with the supply of the control data UADATA. In the example, since all the CGI lines must be set to the same potential as that of the CG line, the control signal UADATA is entirely set to high data.

After the first register 22a in the CG driver 22 and the first register 5a in the HVSW 5 have received these data, a clock signal CGEN is activated to transfer data from the first register 22a in the CG driver 22 to the second register 22b. Further, a clock signal UAEN is activated to transfer data from the first register 5a in the HVSW 5 to the second register 5b.

In the example, at a time t3, the transfer operation of the control signal is completed on the falling edges of signals CGEN and UAEN. Together with the above operation, from time t3, CG lines CG <0> to CG <3> of respective CG driver units 22-0 to 22-31 are set to voltages VREAD, VCGRV, VREAD and VREAD based on the control data CGDATA<3:0>.

Further, at time t3, CGI lines CGI <0> to CGI <3> of respective HVSW units 5-0 to 5-31 are set to voltages VREAD, VCGRV, VREAD and VREAD based on the control data UADATA.

Together with the above operation, at time t3, the row decoder 2 is enabled by making a signal RDEC high, and the data read operation is executed.

Note that although the explanation has been made assuming that the CG driver 22 and the HVSW 5 are operated at the same time, it is not necessary to operate the CG driver 22 and the HVSW 5 at the same time at all times.

To execute the cache read during a period from a start of execution of the read operation to a completion of the read operation at a time t4, a preparation for reading a subsequent word line is executed. That is, in the example, it is previously instructed by a command externally supplied to the non-volatile semiconductor storage device to read a word line WL2. In response to the instruction, the control data CGDATA<3:0> is set to the first registers 22a of CG driver units 22-0 to 22-31.

More specifically, as to the control data CGDATA<3:0>, 2h is placed on CG line CG <2>, and 8h is placed on CG lines CG <0>, CG <1>, and CG <3>. At the time the control data CGDATA<3:0> has been transferred, data representing the potential necessary to read word line WL1 is held in the second register 22b in the CG driver 22, data representing the potential necessary to read word line WL2 is held in the first register 22a to prepare to execute a subsequent read, and it is waited that data is transferred from the first register 22a to the second register 22b.

In contrast, when the read operation has been completed at time t4, unless the cache read operation is executed, the word line is discharged. However, when the cache read operation is executed, the potential of the CG lines is changed at only the portions where the potential is changed when word line WL1 is read and word line WL2 is read next. That is, clock signal CGEN is asserted, and data of the first register 22a of CG driver units 22-0 to 22-31 is transferred to the second register 22b. With the operation, a subsequent read operation, i.e. a read operation of word line WL2 is started.

Specifically, in the example, a voltage of the CG line CG <1> is changed from voltage VCGRV to voltage VREAD, and a voltage of the CG line CG <2> is changed from voltage VREAD to voltage VCGRV. Together with the operation, a voltage of the CGI line CGI <1> is changed from voltage VCGRV to voltage VREAD, and a voltage of the CGI line CGI <2> is changed from voltage VREAD to voltage VCGRV. With the operation, the read operation of word line WL2 is started.

At a time t5, when word line WL2 has been read and a subsequent read has not been instructed, to complete a series of read operations, initialization signals CG_INITn and UA_INITn are asserted and the CG and CGI lines are discharged, thereby completing the read operation.

According to the second embodiment, the CG driver 22 has at least the two different registers, i.e., the first register 22a and the second register 22b. When the cache read is executed, in two continuous read operations, the CG lines having the same potential are set while keeping a charged state, and the potential of the CG lines having a different potential is changed. Accordingly, the potential of the CG lines and the CGI lines corresponding to read non-selected word lines can be maintained. Accordingly, the number of CG and CGI lines which are charged, discharged, and recharged can be minimized so that the current drawn during a read can be reduced by using electric charge efficiently. Moreover, since the CG and CGI lines can be charged and discharged at high speed, the cache read can be executed at high speed.

<Modification of Second Embodiment>

Figure 14:
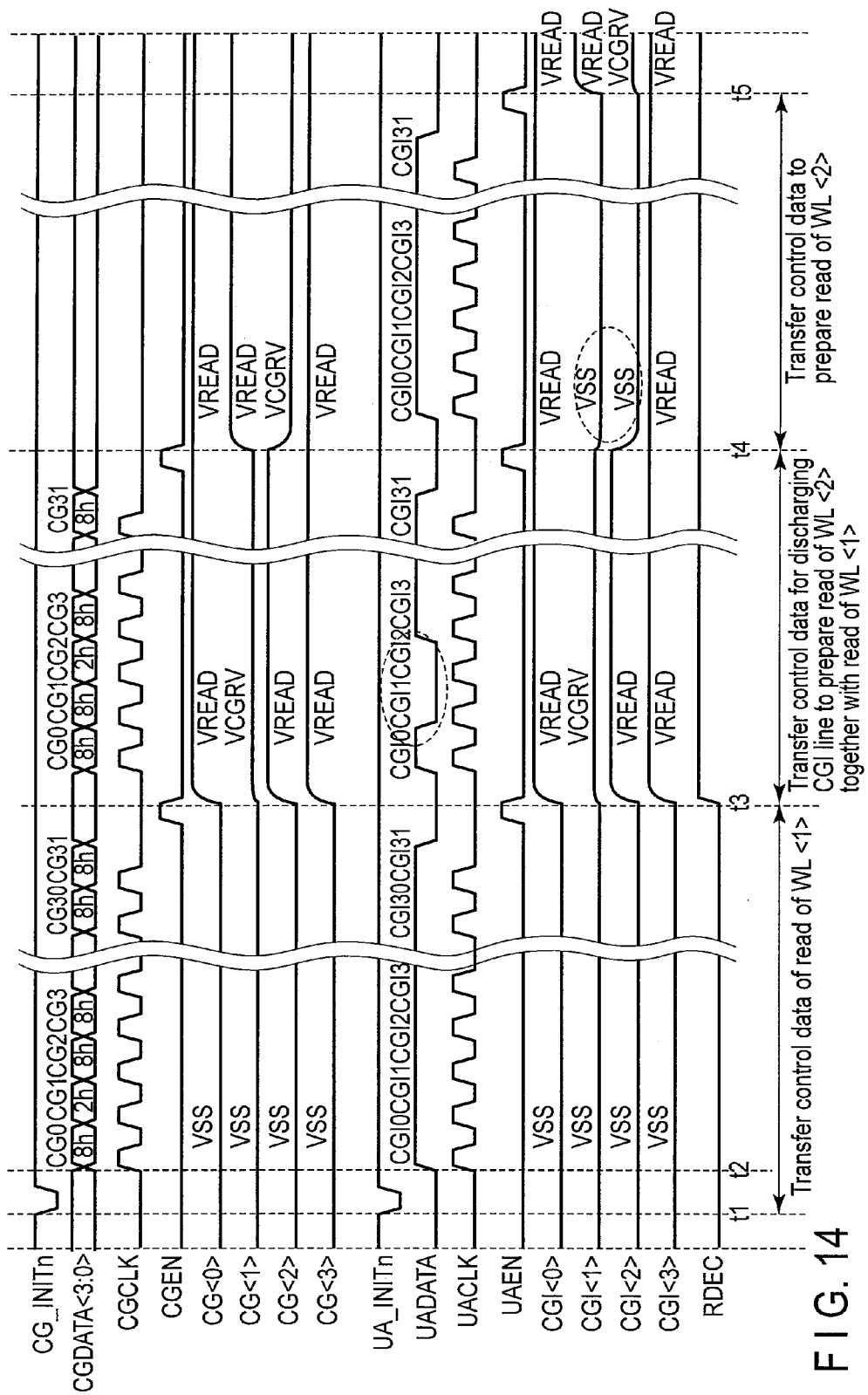
FIG. 14 is a waveform diagram for explaining an operation of a modification of the second embodiment.

FIG. 14 shows a modification of the second embodiment and shows a waveform diagram a CG driver 22 and a HVSW 5.

The modification assumes a case that at the time of a cache read in which a word line WL1 and a word line WL2 are continuously read, CGI lines are recharged after all or some of the CGI lines have been discharged in consideration of a so-called disturb and the like.

FIG. 14 shows that only some of the CGI lines, specifically, only word lines WL1 and WL2 are discharged, and word line WL1 is read and then word line WL2 is read while maintaining the level of the CGI lines other than word lines WL1 and WL2.

In FIG. 14, operations at a time t1 and a time t2 are the same as those of FIG. 13.

At a time t3 and thereafter, a CG line and the CGI line are set to predetermined potentials VCGRV and VREAD to read word line WL1. Since a cache read operation is executed, it is previously instructed by a command externally supplied to a non-volatile semiconductor storage device to read the other word line WL2 next. Accordingly, an operation for preparing to execute a subsequent read operation is executed.

Specifically, to read word line WL2, control data CGDATA<3:0> for determining the potential of the CG driver 22 is supplied to the CG driver 22 by a clock signal CGCLK. More specifically, as to the control data CGDATA<3:0>, 2h is placed on CG line CG <2>, and 8h is placed on CG lines CG <0>, <1>, and <3>. At the time the control data has been transferred, potential data necessary to read word line WL1 is held in a second register 22b in the CG driver 22 to thereby control transistors 22d-0 to 22d-4, potential data necessary to read word line WL2 is held in a first register 22a to prepare to execute a subsequent read, thereby it is made to wait for the data to be transferred from the first register 22a the second register 22b.

Further, at the same time, the HVSW 5 sets control data UADATA to the HVSW 5 to once set a discharge potential to word line WL1 from read selection potential VCGRV and to once set a discharge potential to word line WL2 from read non-selection potential VREAD.

Specifically, the portions of CG lines CGI <1> and CGI <2> of the control data UADATA are made low and the portions thereof other than the above portions are made high. The control data UADATA is held in a first register 5a of the HVSW 5 according to a clock signal UACLK, thereby it is made to wait for the data to be transferred from the first register 5a to a second register 5b.

Thereafter, at a time t4, a clock signal CGEN is activated to change the potential of the CG driver 22 and further a clock signal UAEN is activated in the HVSW 5 to discharge some of the CGI lines.

When the CGI lines have been discharged, clock signal UACLK is supplied to supply the control data UADATA of the HVSW 5 to prepare for a subsequent read operation.

At a time t5, when clock signal UAEN has been asserted, a potential VCGRV necessary to read word line WL2 is applied to CGI line CGI <2> from a state that some of the CGI lines, i.e., CGI lines CGI <1> and CGI <2> are discharged, and a voltage VREAD is applied to CGI line CGI <1>.

According to the modification of the second embodiment, since the HVSW 5 is provided with the first register 5a and the second register 5b, a different potential state can be set to the CG lines and the CGI lines and further the CGI lines can be individually discharged. Accordingly, in the cache read operation, since the CG, CGI, and word lines can be charged and discharged when necessary, electric charge efficiency during a read can be improved, i.e., the current drawn can be further reduced and higher speed operation can be executed than in the case where all the word, CG, and CGI lines are discharged and thereafter charged.

That is, at time t4, when the potential of CG lines CG <1> and CG <2> is changed, although the HVSW 5 corresponding thereto is set to a discharge potential, since the potential of CG lines CG <0> and CG <3> is maintained, the load is reduced when viewed from a booster circuit. Accordingly, the peak current when the potential is changed can be limited.

Third Embodiment

The second embodiment and the modification of the second embodiment have explained the cache read operation. A third embodiment will explain a command sequence in a cache read operation.

FIG. 15 schematically shows a three-dimensionally stacked non-volatile semiconductor storage device according to the third embodiment, and the same portions as those of FIG. 1 are denoted by the same reference numbers.

FIG. 15 is different from FIG. 1 in that a signal CACHEOK is output from a state machine 17 and supplied to a command decoder 13 and that a signal CMD_2ndREAD is supplied from the command decoder 13 to the state machine 17. As described later, signal CACHEOK is a signal showing a period during which a second read address can be received, and signal CMD_2ndREAD is a signal showing that a second read command (read command at a second time) corresponding to the second read address has been received.

Figure 16B:
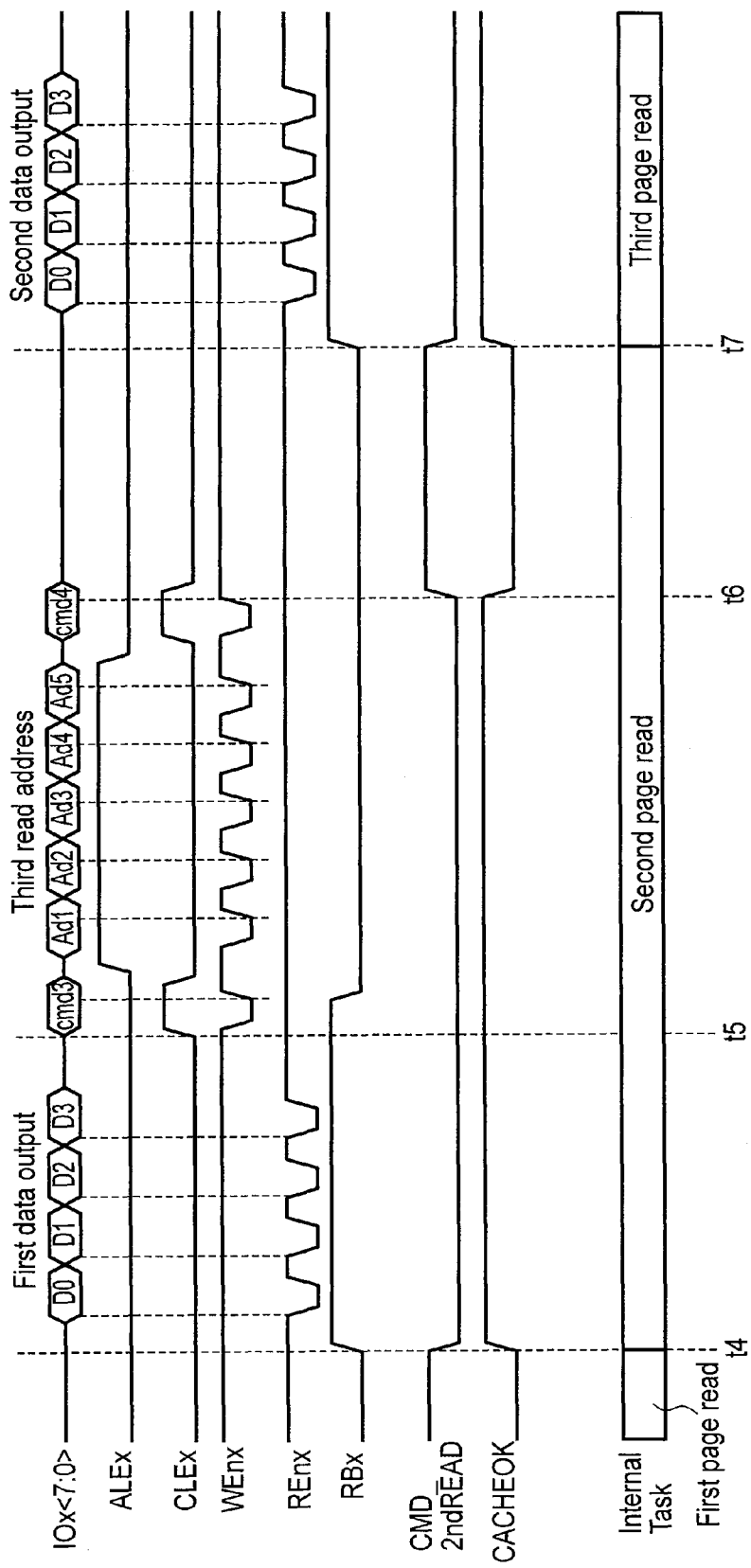
FIG. 16B is a waveform diagram showing an operation following an operation of FIG. 16A.

FIG. 16A to FIG. 16C show the command sequence of the cache read operation of the non-volatile semiconductor storage device shown in FIG. 15 and show an example for executing the cache read operation to three different pages according to a command externally supplied. In the drawings, Internal Task shows a task state of the state machine 17 of the non-volatile semiconductor storage device, and, for example, a first page read shows that the state machine 17 reads a first page and the potential of the CG line and the like is set to the potential of the first page read.

As shown in FIG. 16A, first, when a signal RBx (ready/busy) is in a ready state (high), first read addresses (Ad1 to Ad5) are supplied, together with a command (cmd1). Note that, although not shown, signal RBx is an output signal pin provided with the non-volatile semiconductor storage device, and, for example, the state machine 17 determines a signal state of the output signal pin.

At a time t1, the read operation of the non-volatile semiconductor storage device is started according to a command (cmd2). At the time, the non-volatile semiconductor storage device sets signal RBx to busy (low) and notifies it externally.

The state machine 17 of the non-volatile semiconductor storage device controls the read operation. At the time, the state machine 17 activates signal CACHEOK (high) and shows that the state machine 17 is in a state capable of receiving the second read address. Signal CACHEOK is supplied to the command decoder 13.

As shown in FIG. 16A, the second read address is externally supplied together with a command (cmd3) during a period of the first page read and during a period in which signal CACHEOK is asserted.

At a time t2, when it is instructed by a command (cmd4) to execute the read operation, output signal CMD_2ndREAD of the command decoder 13 is asserted (high). A read executed by the second read address is received at least once at a time t3 until signal CACHEOK becomes inactive (low).

Time t3 is preferably set to a time during the first page read and before a time t4 (read operation at a second time) of the second embodiment because the read operation of the first page read and a second page read can be continuously executed while reusing electric charge as in the second embodiment.

At time t4 shown in FIG. 16B, when the first page read has been completed, signal RBx is made high, thereby it is shown that data can be output to IOx<7:0>. Next, the data having been read according to the first read address is externally output by toggling signal REnx.

In contrast, at time t4, the non-volatile semiconductor storage device starts the second page read simultaneously with the output of the data by the state machine 17 according to the second read address input previously.

Further, since a state capable of receiving a third read address is achieved, the state machine 17 activates signal CACHEOK again. Further, since a second page read operation has been start, the command decoder 13 deactivates signal CMD_2ndREAD according to signal CACHEOK.

Thereafter, at a time t5, the third read address is received together with the command (cmd3), and when it is instructed to execute the read operation by the command (cmd4) at a time t6, the command decoder 13 activates signal CMD_2ndREAD likewise time t2. With the operation, the state machine 17 deactivates signal CACHEOK.

At a time t7, when the second page read has been completed, signal RBx is made high likewise at time t4, thereby it is shown that the data having been read can be output to IOx<7:0>, and the second data is externally output by toggling signal REnx.

Simultaneously with the above operation, the state machine 17 starts the read operation of a third page according to the third read address.

Further, since the state machine 17 has become a state capable of receiving a fourth read address, the state machine 17 activates signal CACHEOK, and since the read operation of the third page has been started, when signal CACHEOK has been activated, the command decoder 13 deactivates signal CMD_2ndREAD.

At a time t8 shown in FIG. 16C, the state machine 17 receives the fourth read address or receives a finish command (cmd5) for finishing the cache read. The command (cmd5) can be also input at a timing when the second and third read addresses are supplied. When the command (cmd5) has been received, a command decoder 15 keeps signal CMD_2ndREAD in a deactivated state. In contrast, the state machine 17 deactivates the signal CACHEOK.

At a time t9, when the third page read has been completed, signal RBx is made high, and the third data which has been read by the third page read is externally output via IOx<7:0> by toggling signal REnx. In contrast, since signals CMD_2ndREAD and CACHEOK have been deactivated, the state machine 17 is placed in an idle state (ready state) without executing a subsequent read operation.

According to the third embodiment, the state machine 17 outputs signal CACHEOK showing whether or not a subsequent command can be input, and when the command decoder 13 has received the read command the second time, the command decoder 13 outputs signal CMD_2ndREAD. When signal CMD_2ndREAD is high and a continuous read can be executed, the CG and CGI lines are charged and discharged only in necessary portions thereof as at, for example, times t3 to t4 shown in FIG. 13. Further, when signal CMD_2ndREAD is low, since the continuous read is not executed, an appropriate potential is set by discharging all the CG and CGI lines at time t4 and thereafter. Accordingly, the cache read operation can be precisely and efficiently controlled on the basis of signals CACHEOK and CMD_2ndREAD.

<Modification of Third Embodiment>

FIG. 17 shows a modification of the third embodiment.

In the third embodiment shown in FIG. 16A, after the first read address has been received and the read operation of the first page has been started, the second read address is received. However, when it has been previously determined to execute the continuous read operation, it is also possible to start the read operation of the first page after the first read address and the second read address have been received.

That is, as shown in FIG. 17, in the modification of the third embodiment, a state machine 17 activates a signal CACHEOK at a time (time t1) when a first read address has been received and an execution instruction (cmd2) for executing a read operation has been received. However, a signal RBx and a state machine 17 remain in a ready state. In the state, a second read address is received together with a command (cmd3).

Thereafter, at a time t2, when a command (cmd4) for instructing to execute the read operation has been received, the command decoder 13 activates a signal CMD_2ndREAD and the state machine 17 starts the read operation of a first page. Operations executed thereafter are the same as those of FIGS. 16A, 16B, and 16C.

According to the modification of the third embodiment, when it has been previously determined to execute the continuous read, it is possible to start the read operation after the first and second read addresses have been continuously supplied, thereby the same effect as that of the third embodiment can be obtained.

Fourth Embodiment

As shown in FIG. 16A, the third embodiment has explained that after the first read address has been received, the second read address is received between times t1 and t3. Since time t1 is a time at which a not shown controller externally connected to the non-volatile semiconductor storage device issues the command (cmd2), the timing of issue is definite. However, since the timing of time t3 is determined by the state machine 17 in the non-volatile semiconductor storage device, the controller cannot be aware of the timing of time t3. Accordingly, since the controller cannot determine whether or not the second read address can be received by the non-volatile semiconductor storage device, this is not preferable in the view point of convenience.

To cope with the problem, a fourth embodiment makes it possible to notify whether or not a second read address can be received to a controller.

Figure 18:
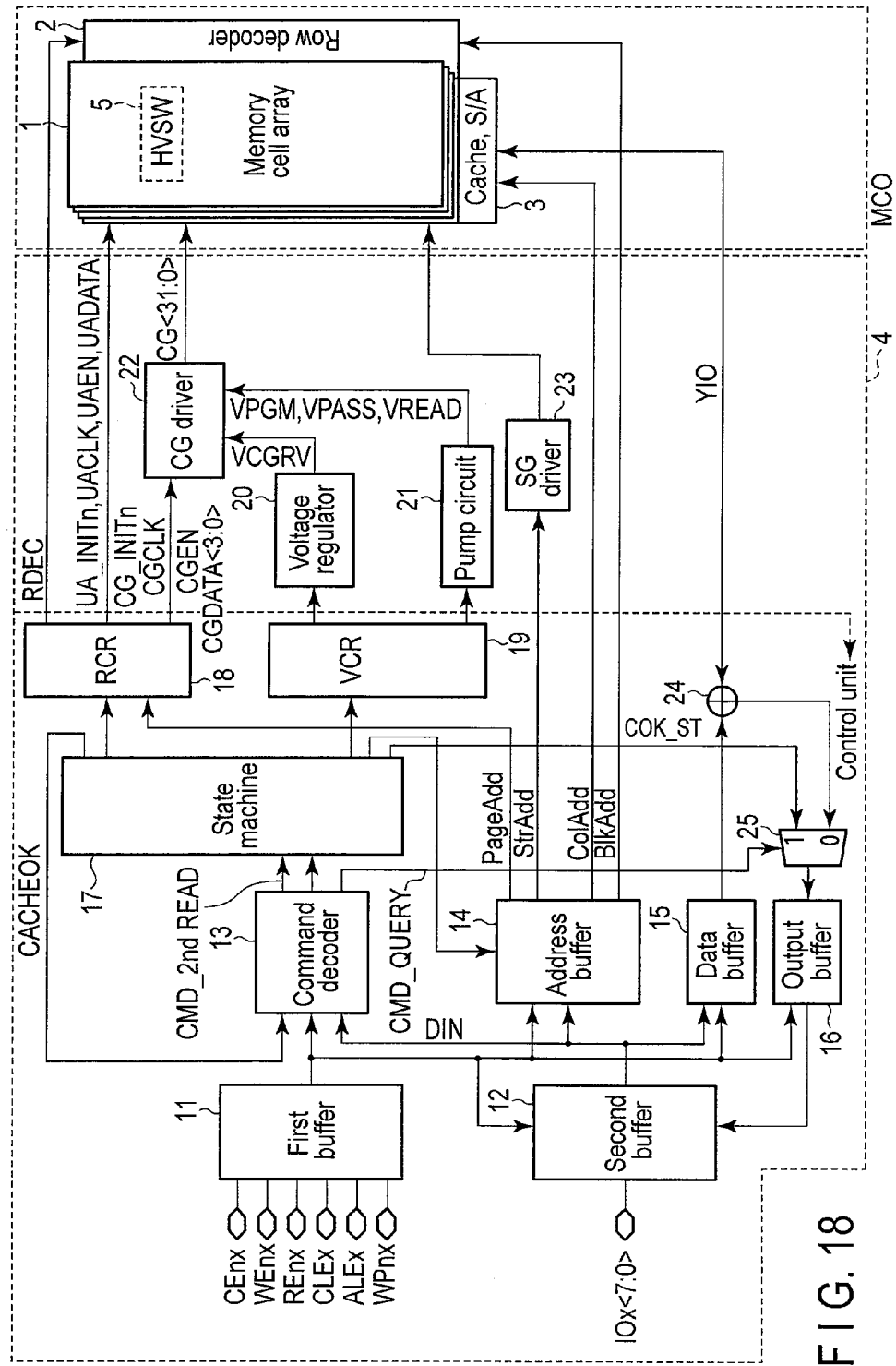
FIG. 18 is a configuration view showing an example of a non-volatile semiconductor storage device according to a fourth embodiment.

FIG. 18 shows an example of a non-volatile semiconductor storage device according to the fourth embodiment. A state machine 17 outputs a signal showing a period relating to times t1 to t3 of FIG. 16A, specifically a signal COK_ST showing that the second read address can be received. Signal COK_ST is supplied to an input terminal of a selector 25 together with an output signal of a distributor 24. An output terminal of the selector 25 is connected to an output buffer 16.

Further, when a query command has been issued from a not shown external controller, a command decoder 13 outputs a signal CMD_QUERY which will be asserted later. Signal CMD_QUERY is supplied to the selector 25 as a selection control signal. When signal CMD_QUERY has been activated, the selector 25 selects output signal COK_ST of the state machine 17, whereas when signal CMD_QUERY has been deactivated, the selector 25 selects the output signal of the distributor 24.

It is assumed here that an output signal CACHEOK of the state machine 17 is activated during a period from a time t1 to a time t3. Further, output signal COK_ST of the state machine 17 is set so as to be activated during a period from time t1 to a time nearer to a finite time (time t1) than time t3. The period is determined in consideration of a time until it is notified that the non-volatile semiconductor storage device can receive the second read address after the not shown controller has issued the query command and the controller issues the second read address and issues an execution command (cmd4).

According to the fourth embodiment, the state machine 17 outputs signal COK_ST for notifying whether or not the second read address can be received by the non-volatile semiconductor storage device, and when the query command has been issued from the external controller, the command decoder 13 activates signal CMD_QUERY, and when signal CMD_QUERY has been activated, the selector 25 selects output signal COK_ST of the state machine 17 in place of output data and sends output signal COK_ST to the controller via the output buffer 16 and a second buffer 12. Accordingly, the controller can be aware of that whether or not the second read address can be received by signal COK_ST supplied from the non-volatile semiconductor storage device.

Fifth Embodiment

A fifth embodiment intends to be able to improve efficiency of utilization of electric charge and reducing the current drawn when a continuous read operation is executed although a cache read operation is not used.

FIG. 19 shows an example of a non-volatile semiconductor storage device according to the fifth embodiment.

In FIG. 19, when a command for instructing that read operation is continuously executed is issued, a command decoder 13 outputs a signal CMD_FAST. Signal CMD_FAST is supplied to a control register 18 and a control register 19.

Figure 20:
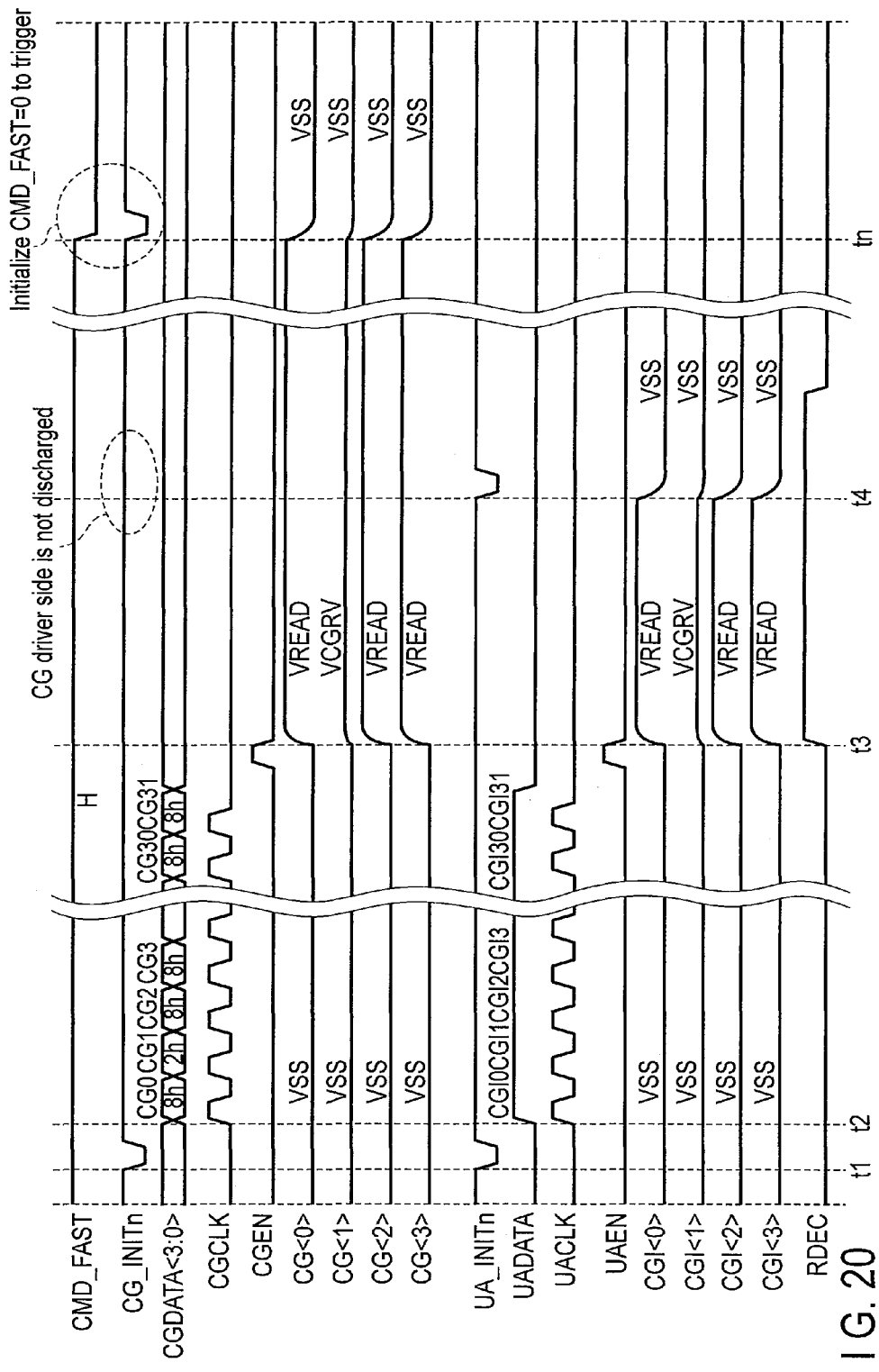
FIG. 20 is a waveform diagram for explaining an operation of the fifth embodiment.

FIG. 20 is a waveform diagram showing an operation of the fifth embodiment.

As shown in FIG. 20, prior to a time t1, the command for instructing that the read operation is continuously executed is previously issued by an external controller. With the operation, signal CMD_FAST output from the command decoder 13 is asserted.

Operations from time t1 to immediately before time t4 are the same as those shown in FIG. 12.

At time t4, when the read operation has been completed, although initialization signal CG_INITn is asserted, i.e., made low in the first embodiment to initialize the CG driver 22, here, initialization signal CG_INITn remains negated, i.e., stays high.

In contrast, at time t4, in an HVSW 5, an initialization signal UA_INITn is asserted and all CGI lines are discharged.

At the time, even if the read operation has been entirely completed, CG lines are held in a bias potential just before the finish of the read operation, specifically, CG lines CG <0>, CG <2>, and CG <3> are kept at a read non-selected potential VREAD, and a CG line CG <1> is kept at a read selected potential VCGRV.

As described above, since the continuous read operation has been instructed by signal CMD_FAST, it is premised that a subsequent read command is issued after a certain time has passed and a read operation is executed. Accordingly, keeping the read non-selected potential VREAD in a charged state can reduce the electric charge required to recharge from a discharge potential to the read non-selected potential VREAD, i.e., the current being consumed in the subsequent read operation.

Note that a charge pump circuit 21 and a voltage regulator 20 for generating the read non-selected potential VREAD are configured to be able to maintain its output voltage level.

In contrast, at a time tn, when signal CMD_FAST is negated, it is determined that no continuous read is executed and the CG lines and the like held in the charged state are discharged.

FIG. 21 shows a command interface of the fifth embodiment and an internal operation of the non-volatile semiconductor storage device.

Prior to a first read command, a command FA for instructing the continuous read is issued. The command FA is held by the command decoder 13, and the command decoder 13 activates signal CMD_FAST.

When a first read command (cmd1, cmd2) is issued, a first read operation is executed. Since the first read operation is an initial read, the read operation is started after a set-up time (tsetup1) necessary to charge the discharged CG lines to a predetermined potential has passed. After the read operation has completed, CGI lines are discharged by a post process. At the time, the CG lines are kept charged.

Next, when a second read command (cmd1, cmd2) is issued, a second read operation is executed. At the time, the CG lines are kept charged, it is possible to shift to the read operation in a time (tsetup2) shorter than the set-up time (tsetup1) necessary in the first read operation. With the operation, a busy period tBUSY2 until signal RBx goes low after the second read command (cmd2) has been received and the read has been completed, i.e., until signal RBx goes high, becomes shorter than a busy period tBUSY1 necessary for the first read operation (tBUSY1>tBUSY2). As a result, the time necessary for a second and subsequent reads can be reduced.

According to the fifth embodiment, when the command FA for continuous read is issued, the command decoder 13 asserts signal CMD_FAST, after the read operation has been completed according to signal CMD_FAST, the control register 18 keeps initialization signal CG_INITn negated and causes the potential of the CG lines to be maintained. Accordingly, in a subsequent read operation, a charge time can be reduced and the current being consumed can be reduced.

The memory cell array 1 need not always have the above-described arrangement, and may have an arrangement described in, for example, U.S. patent application Ser. No. 12/407,403 "Three Dimensional Stacked Nonvolatile Semiconductor Memory" filed Mar. 19, 2009. Alternatively, the memory cell array 120 may have an arrangement described in U.S. patent application Ser. No. 12/406,524 "Three Dimensional Stacked Nonvolatile Semiconductor Memory" filed Mar. 18, 2009, U.S. patent application Ser. No. 12/679,991 "Non-Volatile Semiconductor Storage Device And Method of Manufacturing The Same" filed Mar. 25, 2010, or U.S. patent application Ser. No. 12/532,030 "Semiconductor Memory And Method for Manufacturing Same" filed Mar. 23, 2009. These patent applications are incorporated in this specification by reference in their entirety.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor storage device comprising:
   a memory cell array including a plurality of memory cells;
   a row decoder connected to the memory cell array;
   a potential generating circuit configured to generate a plurality of potentials;
   a plurality of first potential selection circuits connected to the potential generating circuit, the first potential generating circuits being capable of selecting one of output potentials of the potential generating circuit by receiving a first control signal and applying the selected output potential to a first signal line;
   a second potential selection circuit connected to the first signal line of the first potential selection circuits, the second potential selection circuit being capable of applying a potential of the first signal line to a second signal line connected to the row decoder by receiving a second control signal;
   a first discharge circuit arranged in the first potential selection circuit and connected to the first signal line; and
   a second discharge circuit arranged in the second potential selection circuit and connected to the second signal line.

2. The device according to claim 1, wherein
the first and second potential selection circuits are arranged above a silicon substrate, and the memory cells are stacked above the silicon substrate.

3. The device according to claim 1, wherein
in a case that a first read operation and a second read operation are continuously executed, when the first signal line has the same potential as that of the second signal line in the first read operation and the second read operation, the first and second potential selection circuits hold the potentials, and when the potential of the first signal line is different from that of the second signal line, the first and second potential selection circuits change the potential of the first signal line and the potential of the second signal line.

4. The device according to claim 3, wherein
a selection state of the first potential selection circuit can be changed depending on whether or not a first command showing a continuous read which is input prior to a read command is present.

5. The device according to claim 4, wherein
a read time at a second time and thereafter during a period in which the first command has been issued is shorter than a read time at a first time just after the first command has been issued.

6. The device according to claim 1, wherein
each of the first potential selection circuits comprises a first register for receiving the first control signal and a second register connected to the first register.

7. The device according to claim 1, wherein
each of the second potential selection circuits comprises a third register for receiving the second control signal and a fourth register connected to the third register.

8. The device according to claim 1, wherein
in a case that a first read operation and a second read operation are continuously executed, when a potential of the first signal line is different from that of the second signal line in the first read operation and the second read operation, the second potential selection circuit discharges the second signal line by the second discharge circuit and sets a different potential.

9. The device according to claim 8, wherein
a potential selected by the second potential selection circuit is changed by a second read command which is input following a first read command.

10. The device according to claim 9, wherein
the second read command can be received only during a period designated by a non-volatile semiconductor storage device and a unit configured to notify the designated period is provided.

11. The device according to claim 1, wherein
a selection state of the first potential selection circuit can be changed depending on whether or not a first command showing a continuous read which is input prior to a read command is present.

12. The device according to claim 11, wherein
a read time at a second time and thereafter during a period in which the first command has been issued is shorter than a read time at a first time just after the first command has been issued.

13. The device according to claim 3, wherein
the second read operation is instructed by the second read command issued while the first read operation is executed.

\* \* \* \* \*